(12) United States Patent
Ring

(10) Patent No.: US 10,128,635 B2
(45) Date of Patent: Nov. 13, 2018

(54) PHOTONIC INTEGRATED DEVICE WITH DIELECTRIC STRUCTURE

(71) Applicant: BB Photonics Inc., San Jose, CA (US)

(72) Inventor: William S. Ring, High Bridge, NJ (US)

(73) Assignee: BB Photonics Inc., San Jose, CA (US)

( * ) Notice: Subject to any disclaimer, the term of this patent is extended or adjusted under 35 U.S.C. 154(b) by 0 days.

(21) Appl. No.: 15/349,093

(22) Filed: Nov. 11, 2016

(65) Prior Publication Data

US 2017/0141539 A1     May 18, 2017

Related U.S. Application Data

(60) Provisional application No. 62/254,254, filed on Nov. 12, 2015.

(51) Int. Cl.
*G02B 6/12* (2006.01)
*H01S 5/20* (2006.01)
(Continued)

(52) U.S. Cl.
CPC .............. *H01S 5/125* (2013.01); *G02B 6/124* (2013.01); *G02B 6/12007* (2013.01); *G02B 6/131* (2013.01); *H01S 5/0268* (2013.01); *H01S 5/0287* (2013.01); *H01S 5/1021* (2013.01); *H01S 5/124* (2013.01); *H01S 5/141* (2013.01);
(Continued)

(58) Field of Classification Search
CPC ...... H01S 5/125; H01S 5/209; H01S 5/34306; H01S 5/4087; H01S 5/0287; H01S 5/141; H01S 5/124; H01S 5/343; H01S 5/0268; H01S 5/2275; H01S 5/1021; G02B 6/131; G02B 6/124; G02B 6/12007
See application file for complete search history.

(56) References Cited

U.S. PATENT DOCUMENTS 5,288,659 A     2/1994   Koch et al.
6,169,838 B1    1/2001   He et al.
(Continued)

FOREIGN PATENT DOCUMENTS

WO     2014/047443 A1    3/2014
WO     2014/083507 A2    6/2014

OTHER PUBLICATIONS

P. M. Anandarajah, S. Latkowski, C. Browning, R. Zhou J. O'Carroll, R. Phelan, B. Kelly, J. O'Gorman, L. P. Barry, "Integrated Two-Section Discrete Mode Laser", IEEE Photonic. Journal, Dec. 2012, pp. 2085-2094, vol. 4, No. 6.
(Continued)

*Primary Examiner* — John M Bedtelyon
(74) *Attorney, Agent, or Firm* — Sughrue Mion, PLLC

(57) ABSTRACT

A photonic integrated device (PID) for generating single and multiple wavelength optical signals is provided. The PID includes first and second reflective structures having first and second predetermined reflectivities, respectively. A common waveguide is optically coupled to the first reflective structure, and at least one semiconductor waveguide is optically coupled to the second reflective structure. The PID further includes at least one active gain region that is disposed between the first and second reflective structures. In various embodiments, the PID includes at least one of a dielectric waveguide based wavelength dependent element and a dielectric Bragg stack.

29 Claims, 22 Drawing Sheets

(51) Int. Cl.
  *H01S 5/026*  (2006.01)
  *H01S 5/125*  (2006.01)
  *G02B 6/124*  (2006.01)
  *G02B 6/13*  (2006.01)
  *H01S 5/10*  (2006.01)
  *H01S 5/227*  (2006.01)
  *H01S 5/343*  (2006.01)
  *H01S 5/028*  (2006.01)
  *H01S 5/14*  (2006.01)
  *H01S 5/40*  (2006.01)
  *H01S 5/12*  (2006.01)

(52) U.S. Cl.
  CPC ............ *H01S 5/209* (2013.01); *H01S 5/2275* (2013.01); *H01S 5/343* (2013.01); *H01S 5/34306* (2013.01); *H01S 5/4087* (2013.01); *G02B 2006/12104* (2013.01); *H01S 5/026* (2013.01)

(56) References Cited

U.S. PATENT DOCUMENTS

| | | | |
|---|---|---|---|
| 8,693,894 B2* | 4/2014 | Wang | H01L 33/0004 372/102 |
| 9,231,373 B2* | 1/2016 | Fallahi | H01S 3/07 |
| 2009/0092354 A1 | 4/2009 | Joyner | |
| 2015/0030047 A1 | 1/2015 | Cheng et al. | |

OTHER PUBLICATIONS

John O'Carroll, Richard Phelan, Brian Kelly, Diarmuid Byrne, Liam P. Barry, James O'Gorman, "Wide temperature range 0 < T < 85 ° C. narrow linewidth discrete mode laser diodes for coherent communications applications", OSA Technical Digest (CD) (Optical Society of America, 2011), paper We.10.P1.34, Dec. 12, 2011, 3 pages, vol. 19, No. 26.

Simon Osborne, Stephen O'Brien, Kevin Buckley, Robin Fehse, Andreas Amann, John Patchell, Brian Kelly, Dewi R. Jones, James O'Gorman, Eoin P. O'Reilly, "Design of Single-Mode and Two-Color Fabry-Perot Lasers With Patterned Refractive Index", IEEE Journal of Selected Topics in Quantum Electronics, Sep./Oct. 2007, pp. 1157-1163, vol. 13, No. 5.

V. Weldon, J. O'Gorman, J. J. Perez-Camacho, D. Mcdonald, J. Hegarty, B. Corbett, "Methane Sensing with a Novel Micromachined Single-Frequency Fabry-Perot Laser Diode Emitting at 1331 nm", IEEE Photonics Technology Letters, Mar. 1997, pp. 357-359, vol. 9, No. 3.

Oh Kee Kwon, Jong Hoi Kim, Kang Ho Kim, Eun Deok Sim, Hyun Soo Kim, Kwang Ryong Oh, "Monolithically integrated grating cavity tunable lasers", IEEE Photonics Technology Letters, Sep. 2005, pp. 1794-1796, INSPEC, vol. 17, No. 9, Accession No. 8546271.

Oh-Kee Kwon, Eundeok Sim, Kang-Ho Kim, Jong-Hoi Kim, Ho-Gyeong Yun, O Kyun Kwon, Kwang Ryong Oh, "Widely Tunable Grating Cavity Lasers", ETRI Journal, Oct. 2006, pp. 545-554, vol. 28, No. 5.

K. R Poguntke and J. B. D. Soole, "Design of a Multistripe Array Grating Integrated Cavity (MAGIC) Laser", Journal of Lightwave Technology, Dec. 1993, pp. 2191-2200, vol. 11, Issue: 12, ISPEC Accession No. 4660254.

K. R. Poguntke, J. B. D. Soole, A. Scherer, H. P. Leblanc, C. Caneau, R. Bhat, M. A. Koza, "Simultaneous multiple wavelength operation of a multistripe array grating integrated cavity laser", Applied Physics Letters, Apr. 1993, pp. 2024-2026, vol. 62. No. 17.

Shih-Hsiang Hsu, John V. Hryniewicz, Mingcho Wu, Yen-Ping Ho, Gyorgy A. Porkolab, and Yung Jui Chen, "External Cavity Laser Array with Monolithically Integrated Glass Waveguide and Rowland Circle Grating for WDM Applications", Advanced Applications of Lasers in Materials Processing/Broadband Optical Networks/Smart Pixels/Optical MEMs and Their Applications. IEEE/LEOS 1996 Summer Topical Meetings, pp. 24-25, INSPEC Accession No. 5519780.

B. Mroziewicz, "External cavity wavelength tunable semiconductor lasers—a review", Opto-Electronics Review, Dec. 2008, pp. 347-366, vol. 16, No. 4.

Yadong Wang, Yongqiang Wei, Yingyan Huang, Yongming Tu, Doris Ng, Cheewei Lee, Yunan Zheng, Boyang Liu, Seng-Tiong Ho, "Silicon/III-V laser with super-compact diffraction grating for WDM applications in electronic-photonic integrated circuits", Optics Express, Jan. 31, 2011, pp. 2006-2013, vol. 19, No. 3.

International Search Report (PCT/ISA/220) for PCT/US2016/061540 dated Jan. 10, 2017 issued by the International Searching Authority.

\* cited by examiner

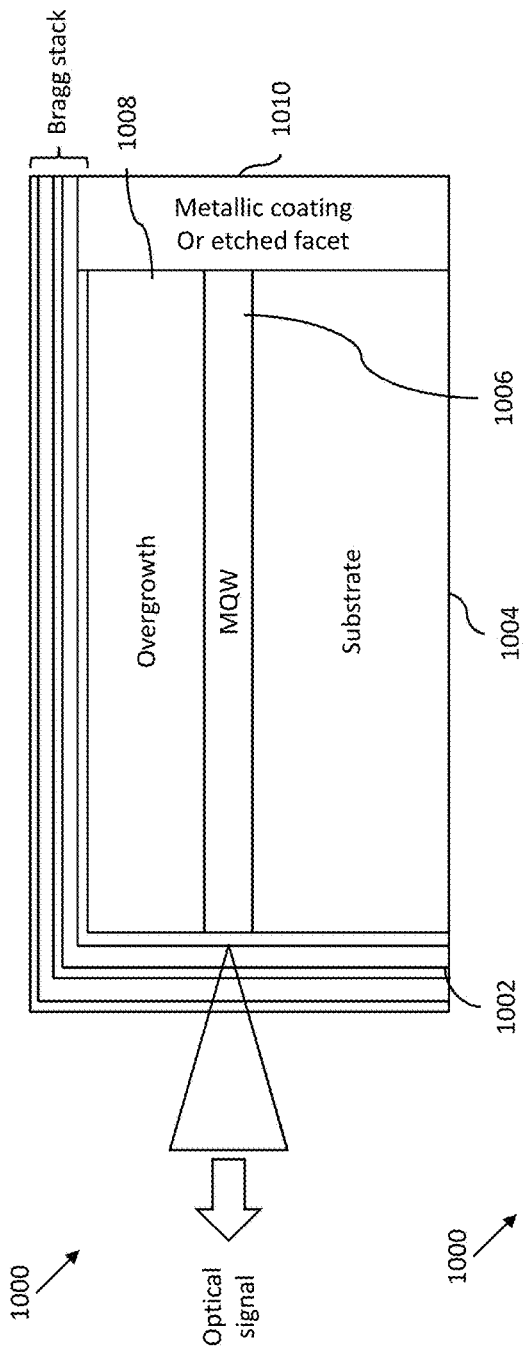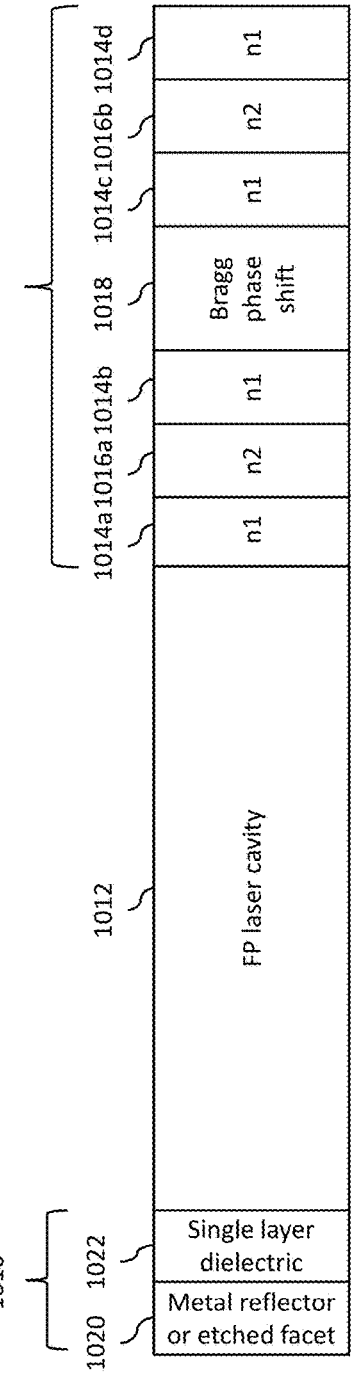
FIG. 10A
FIG. 10B

PHOTONIC INTEGRATED DEVICE WITH DIELECTRIC STRUCTURE

FIELD OF THE INVENTION

This invention relates to a photonic integrated device and more particularly to photonic integrated devices that include dielectric waveguides and dielectric structures on semiconductor substrates as part of single and multiple wavelength optical sources.

BACKGROUND OF THE INVENTION

Photonic Integrated Devices (PIDs) that include Photonic Integrated Circuits (PICs) are monolithically integrated to achieve different optical functionalities. These PICs enable production of complex optical circuits using high volume semiconductor wafer fabrication techniques. Further, the PICs offer to reduce component footprint and eliminate multiple packaging issues and multiple optical alignments. These PICs find application in optical communication networks and mass production of consumer photonics products.

In the context of applications, the advantages of PICs become especially compelling when active waveguide devices, such as laser or photodetector, are combined with one or more passive waveguide devices and elements of the waveguide circuitry, to form a highly functional PIC on a chip with minimal ports. The active waveguide devices that modulate optical signals by electrical means are usually made from artificially grown semiconductors having bandgap structures adjusted to the function and wavelength range of their particular application. Such semiconductors are a natural choice for the base material of the PICs. Accordingly, semiconductor based PICs in which several functions such as optical signal detection, optical modulation, and optical signal emission are implemented in a single monolithic semiconductor chip are a promising solution. Further, indium phosphide (InP) and its related III-V semiconductor material system offer additional benefits as they allow the fabrication of active devices operating in the important wavelength ranges around 1300 nm and 1550 nm, i.e., in the two dominant low-loss transmission windows of the glass fibers. However, even such monolithic integration can provide cost barriers with poor design methodologies, low manufacturing yields, complicated manufacturing processes, and repeated expensive epitaxial growth processes. Accordingly, single step epitaxial wafer growth methodologies in conjunction with established wafer fabrication technologies, have received attention as a means to further enable reduced optical components cost.

Alternatively, gallium arsenide (GaAs) and aluminum gallium arsenide (AlGaAs) may be employed for 850 nm and 1300 nm PICs. Further, PICs may be employed across visible and near ultraviolet ranges through exploitation of other tertiary and ternary semiconductor materials employing indium (In), gallium (Ga), aluminum (Al), arsenic (As), and phosphorous (P). The function of any waveguide device within a PIC composed of epitaxially grown semiconductor heterostructures is pre-determined by its band structure and, more particularly by the bandgap wavelength of the waveguide core layer, cladding layer, and substrate. Accordingly, functionally different devices are typically made from different, yet compatible, semiconductor materials although, through targeted design, some structures can provide for example, optical amplification and photodetection with reversed bias polarity. However, the selection of the substrate and waveguide design has a profound impact both on the design and fabrication of the PIC.

In several PICs ranging from wavelength division multiplexers (WDMs), wavelength division demultiplexers (also referred to as WDMs), optical power (channel) monitors, reconfigurable optical add-drop multiplexers (ROADMs), and dynamic gain (channel) equalizers (DGEs/DCEs), at least one multi-wavelength signal is spectrally dispersed, detected, monitored, and processed on a per wavelength basis. For an array of multi-wavelength signals, the array of multi-wavelength signals are monitored and processed on a per wavelength basis, and then multiplexed to form a multi-wavelength outgoing signal. Such PICs must operate on predetermined channel wavelength plans (i.e., O-band (Original; 1260 nm≤λ≤1360 nm); E-band (Extended; 1360 nm≤λ≤1460 nm); S-band (Short; 1430 nm≤λ≤1530 nm); C-band (Conventional; 1530 nm≤λ≤1565 nm); and L-band (Long; 1565 nm≤λ≤1625 nm) as the optical signals having specific wavelengths are generally provided from a plurality of remote and discrete transmitters. The channel wavelength plans are defined by the International Telecom Union in ITU-T G.694.1 "Spectral Grids for WDM applications: DWDM Frequency Grid." Accordingly, this defines a fixed grid exploiting channel spacings of 12.5 GHz, 25 GHz, 50 GHz, and 100 GHz according to the equation (1) as shown below:

$$193.1 \text{THz} + n^* \text{Spacing}/1000 \quad (1)$$

where Spacing=12.5 GHz, 25 GHz, 50 GHz, and 100 GHz, and n≥0 within the C and L bands of the optical spectrum.

There is also a flexible grid with channels centered at 193.1 THz+n×0.00625 where n≥0, i.e., 6.25 GHz centers, and channel bandwidths defined by 12.5 GHz*m, where m≥0. Instead of dense WDM (DWDM) other systems exploit coarse WDM (CWDM) as specified by ITU-T G.694.2 defining wavelengths from 1271 nm through 1611 nm with a channel spacing of 20 nm.

The temperature stability of the PICs that include optical emitters such as laser diodes (LDs) become a design constraint over operating temperature range 0° C.≤T≤70° C., i.e., during internal customer premises and telecom installations, and −40° C.≤T≤85° C. for external plant. Further, even low temperature dependencies in terms of nm/° C. become significant at channel spacings of ~0.8 nm (100 GHz) and ~0.4 nm (50 GHz). In an example, InP exhibits a temperature sensitivity of ~0.1 nm/° C. such that over 0° C.≤T≤70° C. the wavelength will shift ~6 nm or ~8/~15 channels at 100 GHz/50 GHz respectively. As such, temperature control through heaters and thermoelectric coolers have become a standard for today's deployed discrete LDs in most DWDM and CWDM applications except where low channel counts with wide channel spacing and significant guardbands are specified to enable uncooled LDs and PICs where superluminescent light emitting diodes (SLEDs) are employed.

As we move from considering a discrete distributed feedback (DFB) LD to a 4-channel, a 16-channel, and a 40-channel PIC with integrated CWDM/DWDM MUX, the die footprint increases significantly, such that active temperature stabilization becomes increasingly difficult to achieve. Further, there are additional issues that arise with integration such as thermal crosstalk between adjacent elements and the like. Referring now to FIG. 1, temperature dependent wavelength offsets of InP and SiO$_2$ echelle gratings according to designs of the prior art are shown. A First image 100A shows an expected transmission shift of one channel of an InP Echelle grating WDM with a Gaussian passband characteristic. The peak shifts approximately by +7.6 nm over 85° C. corresponding to $d\lambda/dT \approx +0.09$ nm/° C. Accordingly, in order to deploy such an InP WDM the effective $dn/dT_{AMB}$ of the WDM must be modified by some form of compensation so that the effect of ambient temperature, $T_{AMB}$, is reduced. Within the prior art this may be through exploiting a thermoelectric cooler to maintain the InP die temperature at a nominal value, i.e., $T_{InP}=35°$ C. or through the employment of on-chip micro-heaters exploiting resistive metal traces such that the nominal InP die temperature is set above the maximum operating temperature, i.e. $T_{AMB}=70°$ C.-85° C. in order to avoid control issues at $T_{InP}=100°$ C. Within the prior art it is also known that compensating for the inherent refractive index change of a material can be compensated by integrating a second waveguide section with the opposite dn/dT or by modifying the waveguide design to include a cladding material with a negative dn/dT such that the index change of the waveguide due to change in temperature is reduced. However, heaters and thermo-electric coolers can require significant electrical power consumption and also impose complex thermal management requirements upon the die packaging even for a passive DWDM to ensure uniform temperature before active devices are considered. Further, negative temperature coefficient materials, i.e., dn/dT<0, are typically polymeric and have low coefficients such that compensating a high dn/dT material such as InP requires significant waveguide real estate to achieve the desired balance. However, other waveguide material systems provide different dn/dT and hence $d\lambda/dT$. Referring now to second image 100B, the expected transmission shift of one channel of an $SiO_2$ Echelle grating WDM with a Gaussian passband characteristic is shown. Compared to $dn_{InP}/dT \approx 2 \times 10^{-4}$ silica offers $dn_{SiO2}/dT$ $2 \times 10^{-5}$ such that over 85° C. the center wavelength shifts $\approx 0.8$ nm which is equivalent to $d\lambda/dT \approx +0.009$ nm/° C., an order of magnitude lower than InP. Thus, when such InP based PIC is configured as an optical emitter, the optical emitter will not generate an optical signal at its predetermined wavelength.

Further, certain applications such as optical line termination (OLT) or optical network unit (ONU) outside a plant portion, residence, and business within passive optical networks, include an optical source on each server line card within a server rack of a data center. These optical sources utilize a single emitter such as a DFB laser. The single emitter includes an active layer that is periodically structured as a diffraction grating layer to provide an optical feedback for the single emitter. However, manufacturing of such optical emitter with the diffraction grating layer can provide cost barriers with poor design methodologies, low manufacturing yields, and complicated manufacturing processes. Further, in conventional DFB lasers, the shift in wavelength of an optical signal generated by the DFB lasers is dependent on temperature. Thus, such DFB lasers do not provide a single mode of operation.

A known technique to overcome problem of the temperature dependence is to fabricate a PIC formed on a silicon substrate that includes a dielectric slab as described in Koteles et al in US Patent entitled "Athermal Waveguide Grating based Device having a Temperature Compensator in the Slab Waveguide Region". The dielectric slab has a predetermined thickness, and is spaced apart from the grating element. However, when such PIC is formed using silicon substrate, there is mismatch between the lattice structure of the InP structure and the silicon substrate. Thus, the InP structure cracks due to high stress between the InP structure and the silicon substrate.

Another known technique to overcome the problem is to alter the structure of the optical emitter. Referring now to FIG. 2, an edge-emitting laser 200A is shown. The edge-emitting laser 200A includes a pair of dielectric interference filters formed on opposing facets.

A graph 200B shows an ideal wavelength characteristic of the edge-emitting laser 200A. Each dielectric interference filter is a Fabry-Perot etalon (FP-E) filter. The edge-emitting laser 200A has a resonant dielectric cavity that is sandwiched between the pair of dielectric interference filters. The dielectric interference filter manifests a flat reflectance spectrum with a deep reflectance notch at the center. Accordingly, each FP-E filter transmits over a narrow wavelength range such that the round trip loss of the cavity is high when the wavelength overlaps either of the FP-E filter transmissive ranges. Hence, the characteristic response shows a double-peaked shape with a sharp minimum between the two notch wavelengths, where the sharp minimum determines a lasing wavelength of the optical emitter. However, such cavity losses in the edge-emitting laser 200A lead to a high threshold for lasing, low output power, gain saturation, and wavelength crosstalk.

The semiconductor die acts as a Fabry-Perot cavity when the refractive index of the semiconductor die is greater than the refractive indices of the FP-E filters. Thus, the resultant wavelength characteristic of the edge-emitting laser 200A is actually closer to that depicted in graph 200C where there is no sharp peak in the reflectance. Such edge-emitting laser 200A functions like a broadband superluminescent LED.

It would therefore be beneficial to provide PIC designers with design methodologies for the single and multi-wavelength LDs that are not only compatible with monolithic integration on compound semiconductor PICs but also provide for athermal performance, resolving thermal management issues, and consumption of less power.

Other aspects and features of the present invention will become apparent to those ordinarily skilled in the art upon review of the following description of specific embodiments of the invention in conjunction with the accompanying figures.

SUMMARY OF THE INVENTION

It is an object of the present invention to mitigate limitations in the prior art relating to photonic integrated circuits and more particularly to dielectric waveguides and dielectric structures on semiconductor substrates as part of single wavelength and multiple wavelength optical sources.

In an embodiment of the present invention a photonic integrated device (PID) is provided. The PID comprises an epitaxial structure, a dielectric waveguide based wavelength dependent element, and a dielectric Bragg stack. The epitaxial structure comprises a plurality of compound semiconductor layers, and the dielectric waveguide based wavelength dependent element is disposed within an optical cavity of the PID. The dielectric Bragg stack is disposed at a predetermined region of an active structure. The active structure is disposed on the epitaxial structure and is optically coupled to the dielectric waveguide based wavelength dependent element.

In another embodiment of the present invention, a photonic integrated device (PID) is provided. The PID comprises first and second reflective structures, a dielectric waveguide based wavelength dependent element, and at least one active gain region. The first and second reflective structures have first and second predetermined reflectivities, respectively. The PID further includes a common waveguide and at least one semiconductor waveguide that are optically coupled to the first and second reflective structures, respectively. The dielectric waveguide based wavelength dependent element is formed on first regions of a substrate, the common waveguide, and the at least one semiconductor waveguide. The dielectric waveguide based wavelength dependent element provides a wavelength dependent loss between the first and second reflective structures. The at least one active gain region is disposed between the first and second reflective structures.

In yet another embodiment of the present invention a photonic integrated device (PID) is provided. The PID comprises a first substrate, a semiconductor structure, a dielectric Bragg stack, and a reflector. The semiconductor structure comprises a plurality of layers formed above the first substrate. The semiconductor structure defines a semiconductor waveguide that extends between first and second facets of the semiconductor structure. Further, the semiconductor waveguide provides an optical gain to an optical signal propagating within the semiconductor waveguide. The dielectric Bragg stack comprises a plurality of dielectric layers, and is formed upon the first facet. The reflector is formed upon the second facet. The dielectric Bragg stack provides a peak transmittance at a predetermined wavelength and the reflector provides a peak reflectivity at a plurality of wavelengths of the optical signal.

Various embodiments of the present invention provide a photonic integrated device (PID). The PID comprises a grating element, semiconductor waveguides, a common waveguide, and at least one optical emitter. The at least one optical emitter is disposed above at least one of the common and semiconductor waveguides. The grating element is optically coupled to the semiconductor and the common waveguides. When the PID is configured as multiplexer, the optical emitters generate optical signals having respective predetermined wavelengths. The grating element combines the optical signals and provides a multiplexed output signal. The common waveguide outputs the multiplexed output signal. When the PID is configured as a demultiplexer, the optical emitter generates the multiplexed output signal, and the grating element demultiplexes the multiplexed output signal to generate multiple optical signals. Each semiconductor waveguide outputs the respective optical signal. In one embodiment, the grating element comprises a dielectric waveguide disposed adjacent to at least one of echelle and arrayed waveguide gratings. In another embodiment, the optical emitter includes a semiconductor structure formed on a first substrate, a Bragg stack formed on a first facet of the semiconductor structure, and a reflector formed on a second facet of the semiconductor structure. The Bragg stack includes alternating layers of first and second dielectric layers.

The dielectric waveguide includes materials that have a lower variation of refractive index with temperature, thus providing athermal performance. To reduce power losses, the dielectric waveguide is mode matched to the semiconductor and common waveguides of the semiconductor device. The semiconductor device further includes an anti-reflection coating layer deposited between the waveguide and the dielectric waveguide to reduce the effect of thin film interference. As no heater and thermoelectric coolers are involved in temperature control, the overall size of the semiconductor device is reduced. Further, the optical emitter with the dielectric Bragg stack has a lower variation of the wavelength of the optical signal with change in temperature. Furthermore, adjusting the difference between the refractive indices of the first and second dielectric layers enables single mode operation for the optical emitter. Such optical emitter provides a clear peak in reflectance in the wavelength characteristic of the optical emitter.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention. Embodiments of the present invention will now be described, by way of example only, with reference to the attached Figures, where:

FIG. 10A is a schematic of a semiconductor optical emitter (SOE) exploiting a dielectric Bragg stack according to another embodiment of the present invention;

FIG. 10B is a top view of the SOE of the FIG. 10A according to another embodiment of the present invention;

DETAILED DESCRIPTION

Figure 1:
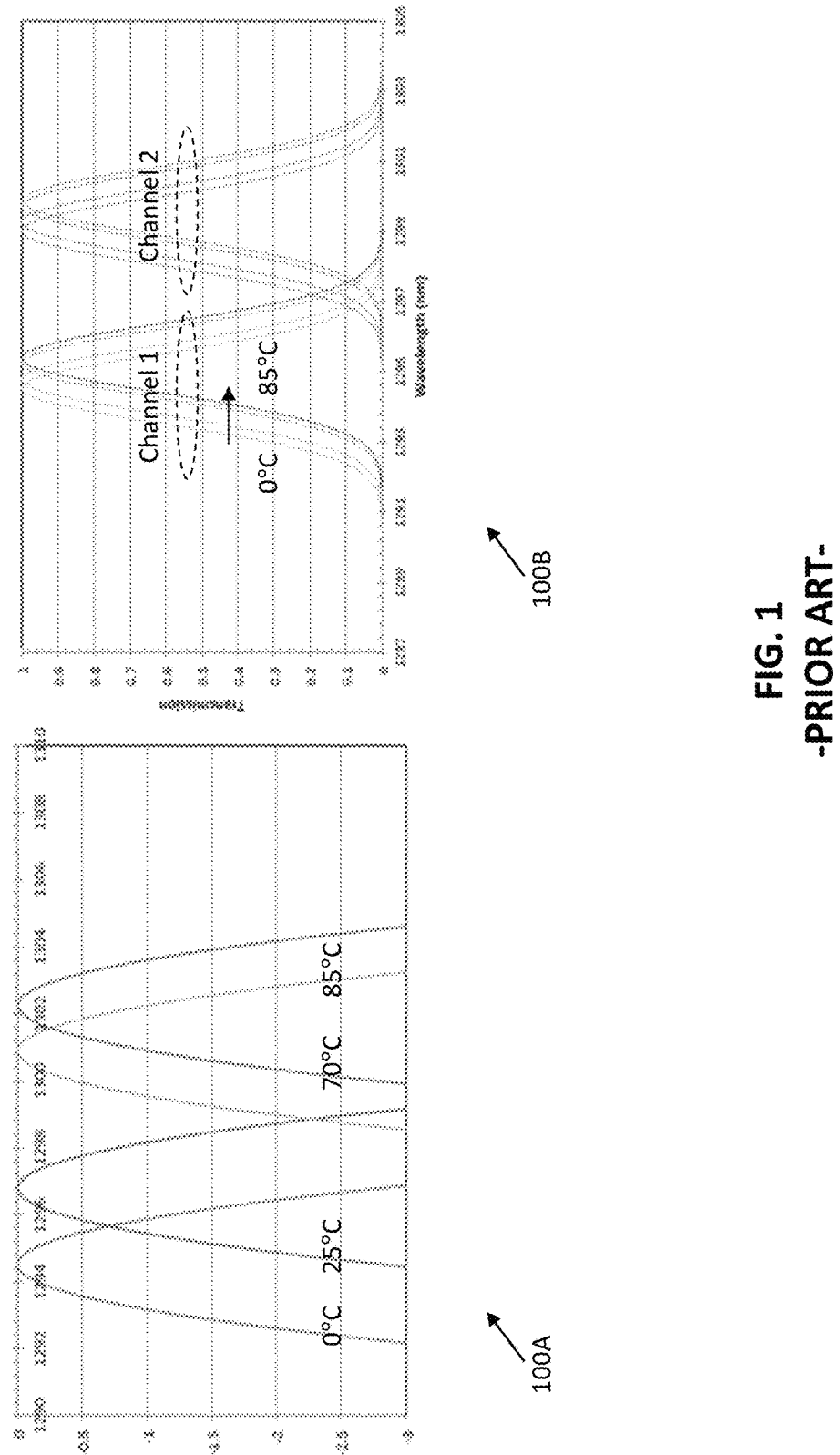
FIG. 1 is a graph showing temperature dependent wavelength offsets for InP and SiO2 echelle gratings according to designs of prior art.
Figure 2:
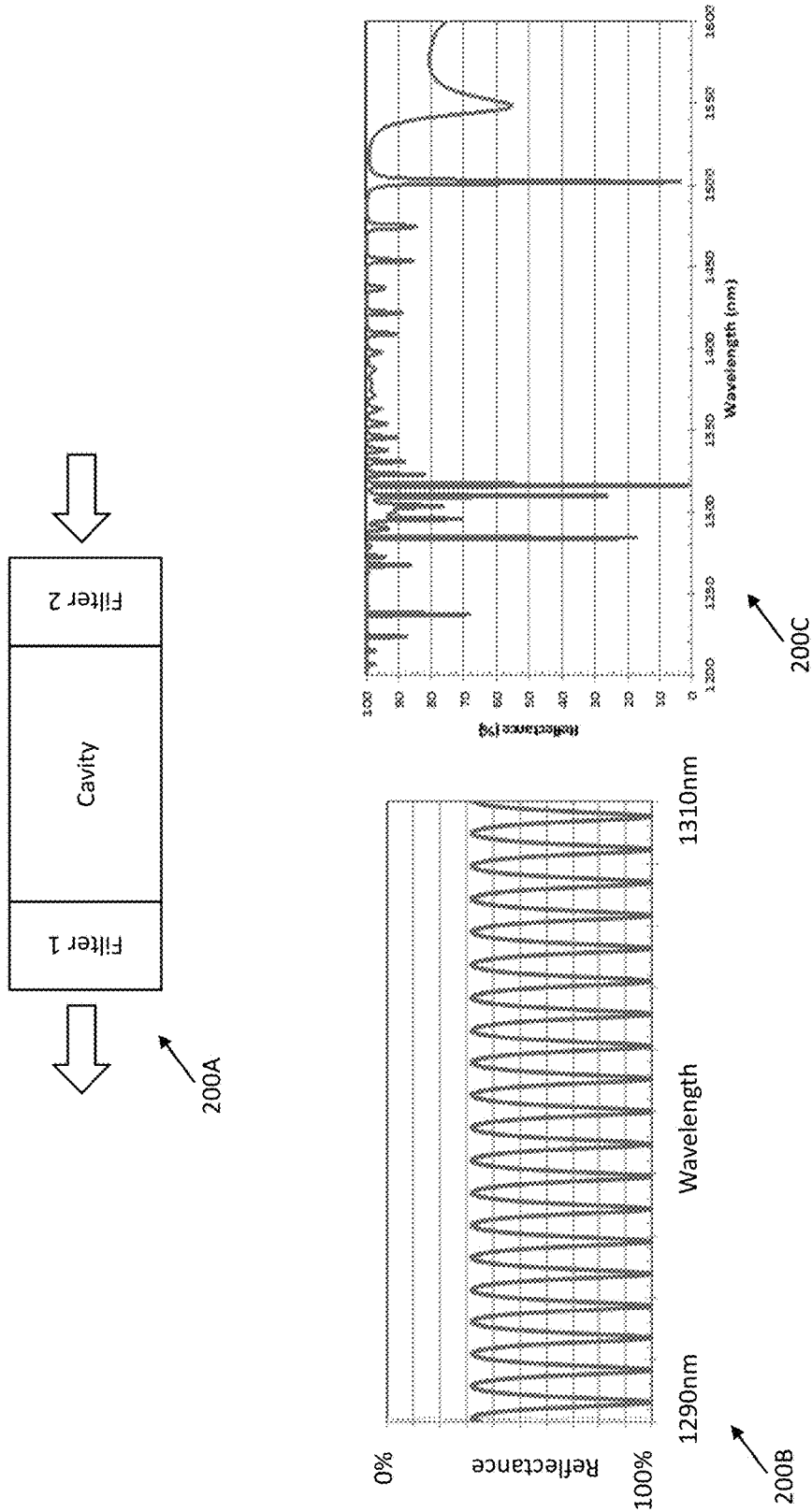
FIG. 2 shows an edge-emitting laser, as well as ideal and calculated wavelength characteristics of the edge-emitting laser, according to design of prior art.

The present invention is directed to photonic integrated devices and more particularly to dielectric waveguides and dielectric structures on semiconductor substrates as part of single wavelength and multiple wavelength optical sources.

The ensuing description provides exemplary embodiment(s) only, and is not intended to limit the scope, applicability or configuration of the disclosure. Rather, the ensuing description of the exemplary embodiment(s) will provide those skilled in the art with an enabling description for implementing an exemplary embodiment. It being understood that various changes may be made in the function and arrangement of elements without departing from the spirit and scope as set forth in the appended claims.

An "emitter" or "distributed feedback (DFB) laser" or "light emitting diode" (LED) as used herein and throughout this disclosure refers to, but is not limited to, a type of optical emitter that uses semiconductor light emitting structures such as semiconductor junctions, pn junctions, pin junctions, quantum structures, and quantum dots. These structures can comprise single or multiple quantum structures and junctions to generate single or multiple wavelengths and combinations thereof. The optical emitters may include, but are not limited to, semiconductor LEDs, semiconductor DFB lasers, semiconductor external cavity lasers (ECLs), and fixed wavelength emitters and tunable emitters. These optical emitters exploit the recombination of electrons and holes within the optical device to generate photons whose color (corresponding to the energy of the photon) is determined by the energy band gap of the semiconductor within which they are generated.

A "semiconductor" as used herein and throughout this disclosure refers to, but is not limited to, a material having an electrical conductivity value falling between that of a conductor and an insulator. The material may be an elemental material or a compound material. A semiconductor may include, but not be limited to, an element, a binary alloy, a tertiary alloy, and a quaternary alloy. Structures formed using a semiconductor or semiconductors may comprise a single semiconductor material, two or more semiconductor materials, a semiconductor alloy of a single composition, a semiconductor alloy of two or more discrete compositions, and a semiconductor alloy graded from a first semiconductor alloy to a second semiconductor alloy. A semiconductor may be one of undoped (intrinsic), p-type doped, n-typed doped, graded in doping from a first doping level of one type to a second doping level of the same type, and graded in doping from a first doping level of one type to a second doping level of a different type. Semiconductors may include, but are not limited to III-V semiconductors, such as those between aluminum (Al), gallium (Ga), and indium (In) with nitrogen (N), phosphorous (P), arsenic (As) and tin (Sb), including for example GaN, GaP, GaAs, InP, InAs, AlN and AlAs.

A "metal" as used herein and throughout this disclosure refers to, but is not limited to, a material (element, compound, and alloy) that has good electrical and thermal conductivity as a result of readily losing outer shell electrons. This may include, but not be limited to, gold, chromium, aluminum, silver, platinum, nickel, copper, rhodium, palladium, tungsten, and combinations of such materials.

An "electrode," "contact," "track", "trace", or "electrical terminal" as used herein and throughout this disclosure refers to, but is not limited to, a material having an electrical conductivity which is optically opaque. This includes structures formed from thin films, thick films, and plated films for example of materials including, but not limited to, metals such as gold, chromium, aluminum, silver, platinum, nickel, copper, rhodium, palladium, tungsten, and combinations of such materials. Other electrode configurations may employ combinations of metals, for example, a chromium adhesion layer and a gold electrode layer.

A "transparent electrode," "transparent contact," "transparent track", or "transparent trace" as used herein and throughout this disclosure refers to, but is not limited to, a material having an electrical conductivity but optical transparency over a predetermined wavelength range, usually the visible region of the electromagnetic spectrum. A common material for visible wavelength transparent electrodes is indium tin oxide (ITO, or tin-doped indium oxide) which is a solid solution of indium(III) oxide and tin(IV) oxide, typically 90%:10% by weight. However, the high cost/limited supply of indium and the fragility and lack of flexibility of layers may mean alternatives are appropriate. Amongst these are carbon nanotube conductive coatings, thin metal films or hybrid material alternatives, such as silver nanowires covered with graphene, inherently conductive polymers (ICPs) and conducting polymers, such as polyaniline and poly(3,4-ethylenedioxythiophene) polystyrene sulfonate (PEDOT:PSS); and amorphous transparent conducting oxides including, for example, aluminum, gallium or indium-doped zinc oxide (AZO, GZO or IZO).

A "substrate" as used herein and throughout this disclosure refers to, but is not limited to, a surface upon which semiconductor structures, such as a PID and embodiments of the invention may be grown. This may include, but not be limited to, InP, GaAs, silicon, silica-on-silicon, silica, silica-on-polymer, glass, a metal, a ceramic, a polymer, or a combination thereof.

An "optical waveguide", "dielectric waveguide", or "waveguide" as used herein and throughout this disclosure refers to, but is not limited to, a dielectric medium or combination of medium invariant along the direction of propagation, supporting the propagation of optical signals within a predetermined wavelength range. An optical waveguide may be at least one of an isolated structure comprising at least a core and a cladding, e.g., an optical fiber, formed as part of a carrier, formed within a substrate, e.g., planar lightwave circuits, photonic integrated device, integrated optical devices, and an optical waveguide. This includes, but is not limited to, flexible optical waveguides formed from extruded glass, extruded doped silica, extruded chalcogenide glasses, and polymer. This further includes, but is not limited to, optical waveguides formed within AlGaAs—GaAs material systems, InGaAsP—InP material systems, ion-exchanged glass, ion-exchanged ferroelectric materials (e.g. proton exchanged LiNbO3), doped ferroelectric materials (e.g. titanium doped lithium niobate), silica-on-insulator, silica-on-silicon, doped silicon, ion implanted silicon, polymer on silicon, silicon oxynitride on silicon, polymer on silicon, Silicon-On-Isolator (SOI) and polymer on polymer.

An "optical fiber" as used herein, and throughout this disclosure refers to a flexible optical waveguide that transmits optical signals over a predetermined wavelength range. This includes, but is not limited to, step-index optical fibers, graded-index optical fibers, silica optical fibers, chalcogenide glass optical fibers, and polymer optical fibers. Such optical fibers may be multimode fibers that support multiple modes. Such optical fibers may be circular, thereby supporting multiple modes that are at least one of laterally, vertically, and radially symmetric modes, rectangular thereby supporting multiple modes laterally but single mode vertically, rectangular supporting multiple modes laterally with limited modes vertically (e.g. 2-5), as well as waveguides with similar or other cross-sections. Such optical fibers may be discrete, in ribbon format assembled from discrete optical fibers with discrete claddings per optical fiber, in ribbon format with common cladding between optical fibers, optical fibers embedded in a polymer flexible film, and optical fibers attached to a polymer flexible film.

A "multiplexer" (MUX) as used herein, and throughout this disclosure, refers to a device that combines a plurality of source channels and provides a single combined output. This includes, but is not limited to, passive multiplexers, active multiplexers with transmitters and WDM, active multiplexers with receivers, transmitters and WDM, unidirectional multiplexers and bidirectional multiplexers.

A "demultiplexer" (DMUX) as used herein, and throughout this disclosure, refers to a device that combines a plurality of source channels and provides a single combined output. This includes, but is not limited to, passive demultiplexers, active demultiplexers with receivers and WDM, active demultiplexers with receivers, transmitters and WDM, unidirectional demultiplexers.

Figure 3:
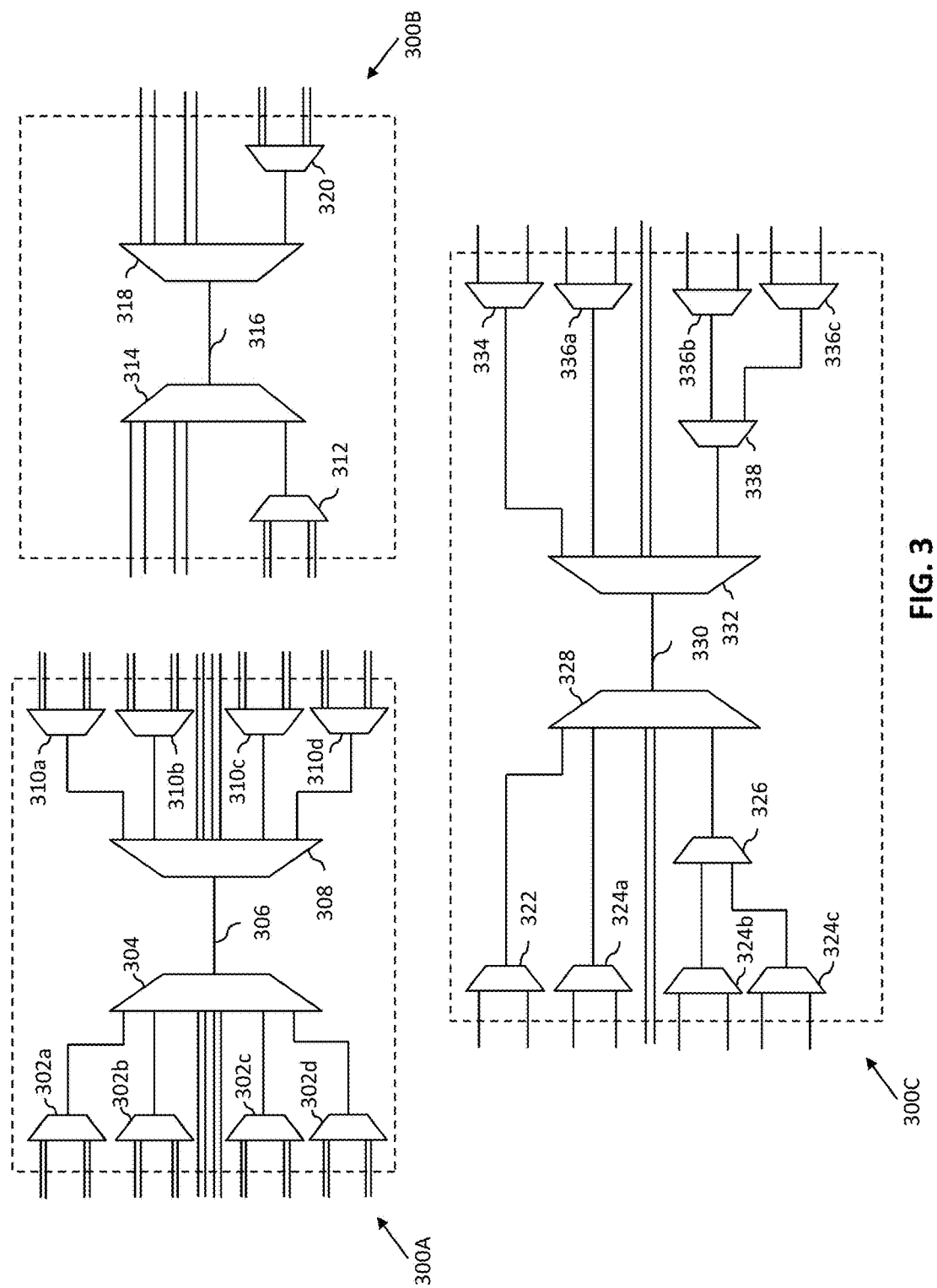
FIG. 3 is a schematic block diagram of first through third optical networks that exploit low, medium, and high channel count wavelength division multiplexers and demultiplexers, according to an embodiment of the present invention.

Referring now to FIG. 3, first through third optical networks 300A-300C exploiting low, medium, and high channel count dense wavelength division multiplexers (DWDM MUXs) and DWDM demultiplexers (DMUXs), respectively, in accordance with an embodiment of the present invention are shown. The first optical network 300A represents one optical plane of two optical planes, one for transmission from "left" to "right" commonly referred to as "east" in optical links and the other for transmission from "right" to "left" commonly referred to as "west." Each of the east and west links of the first optical network 300A includes first through fourth MUXs 302a-302d, a first DWDM MUX 304, an optical fiber 306, a first DWDM DMUX 308, and first through fourth DMUXs 310a-310d. Each of the first DWDM MUX 304 and the first DWDM DMUX 308 support 40 channels. Further, the first DWDM MUX 304 has 8 discrete DWDM input channels. In an embodiment, each of the first through fourth MUXs 302a-302d receives corresponding first through fourth input optical signals. The first through fourth input optical signals received by the first MUX 302a is in a first predetermined sub-band. Further, the corresponding first through fourth input optical signals received by the second through fourth MUXs 302b-302d are in second through fourth predetermined sub-bands, respectively. Thus, the first through fourth MUXs 302a-302d output first through fourth output optical signals in a corresponding sub-band. The first DWDM MUX 304 is connected to the first through fourth MUXs 302a-302d for receiving the first through fourth output optical signals, respectively. The first DWDM MUX 304 further receives fifth through eighth input optical signals. The first DWDM MUX 304 outputs a fifth output optical signal. The optical fiber 306 is coupled to the first DWDM MUX 304 for receiving the fifth output optical signal. The first DWDM DMUX 308 is coupled to the optical fiber 306 for receiving the fifth output optical signal. The first DWDM DMUX 308 has 8 discrete DWDM output channels. The first through fourth DWDM DMUXs 310a to 310d are connected to the first DWDM DMUX 308. The first DWDM DMUX 308 receives the fifth output optical signal and separates the fifth output optical signal into intermediate output signals, such that each intermediate output signal is a sub-band of the fifth output optical signal. The first through fourth DWDM DMUXs 310a-310d receive the intermediate output signals and output the corresponding intermediate output signals. In another embodiment, the first DWDM MUX 304 and the first DWDM DMUX 308 may provide direct optical throughput for at least one of four 8-channel bands and 8 single channels for optical-electrical-optical (OEO) conversion. In an example, with the first DWDM MUX 304 each 8-channel band is multiplexed, coupled into the electrical domain via a photodetector, coupled to an emitter, and then multiplexed with the other channels.

The second optical network 300B includes an expansion DWDM MUX 312, a second DWDM MUX 314, a single mode optical fiber 316, a second DWDM DMUX 318, and an expansion DWDM DMUX 320. The second DWDM MUX 314 is coupled to the single mode optical fiber 316. The second DWDM DMUX 318 is coupled to the single mode optical fiber 316. Each of the second DWDM MUX 314 and the second DWDM DMUX 318 supports 40 channels but may support 8, 16, 24, 32, and 48 channels. Further, each of the second DWDM MUX 314 and the second DWDM DMUX 318 includes an optical interleaver (not shown) that multiplexes and demultiplexes a pair of 100 GHz combs offset by 50 GHz relative to one another into a combined 50 GHz DWDM comb, respectively. The expansion DWDM MUX 312 and the expansion DWDM DMUX 320 are 40 channel DWDM devices with their frequency grids offset by 50 GHz relative to the second DWDM MUX 314 and the second DWDM DMUX 318.

In another embodiment, a band filter may be employed such that the second DWDM MUX 314 and the second DWDM DMUX 318 are operating in a non-overlapping wavelength range, e.g., L-band between 1565 nm$\leq\lambda\leq$1625 nm and C-band between 1530 nm$\leq\lambda\leq$1565 nm.

The third optical network 300C includes a first 8-channel coarse wavelength division multiplexer (CWDM MUX) 322, second through fourth 8-channel DWDM MUXs 324a-324c, a fifth CWDM MUX 326 that operates at 1551 nm, a CWDM Band MUX 328 with 1310 nm Overlay, a single mode optical fiber 330, a CWDM band DMUX 332 with 1310 nm Overlay, a first CWDM 8-channel DMUX 334, second through fourth 8-channel DWDM DMUXs 336a-336c, and a fifth CWDM DMUX 338 that operates at 1551 nm. The CWDM Band MUX 328 is coupled to the single mode optical fiber 330. The first CWDM MUX 322 and the second DWDM MUX 324a are connected to the CWDM Band MUX 328. The third and fourth DWDM MUXs 324b and 324c are connected to the CWDM Band MUX 328 by way of the fifth CWDM MUX 326. The first CWDM MUX 322 has a 1310 nm wideband channel with 8 CWDM input channels and the second DWDM MUX 324a has a 1531 nm CWDM input channel supporting 8 DWDM wavelengths. Each of the third and fourth DWDM MUXs 324b and 324c support 8 channel DWDM wavelengths. In another embodiment, the CWDM band MUX 328 is connected to 6 CWDM channel inputs.

The CWDM band DMUX 332 is connected to the first DMUX 334 and the second DMUX 336a. Further, the CWDM band DMUX 332 is connected to the third and fourth DMUXs 336b and 336c by way of the fifth DMUX 338. The first DMUX 334 has a 1310 nm wideband channel with 8 CWDM output channels and the second DMUX 336a has a 1531 nm CWDM channel supporting 8 DWDM wavelengths. The third and fourth DWDM DMUXs 336b and 336c each support 8 channel DWDM wavelengths. In another embodiment, the CWDM band DMUX 332 is connected to 6 CWDM channel inputs.

Figure 4:
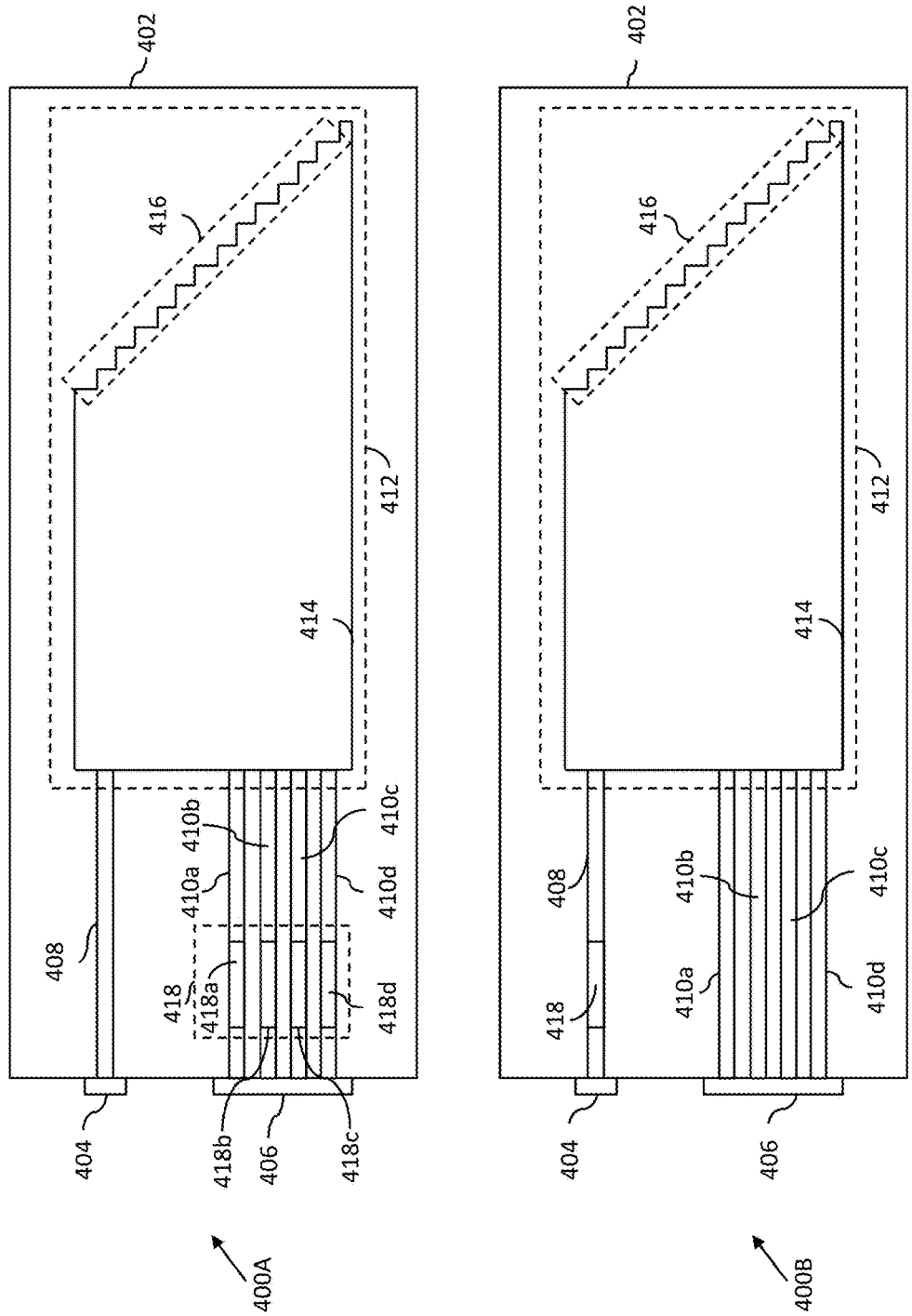
FIG. 4 is a schematic of a photonic integrated device (PID) according to an embodiment of the present invention.

Referring now to FIG. 4, photonic integrated devices (PIDs) 400A and 400B in accordance with an embodiment of the present invention are shown. Each of the MUXs 302a-302d, 304, 312, 314, 322, 324a-324c, 326, and 328 in the first through third optical networks 300A-300C can be implemented using the PID 400A. Further, each of the DMUXs 308, 310a-310d, 318, 320, 332, 334, 336a-336c, and 338 in the first through third optical networks 300A-300C can be implemented using the PID 400B. The PIDs 400A and 400B are grown by epitaxy on a corresponding substrate 402. In presently preferred embodiment, the substrate 402 is a III-V semiconductor material. In an example, the III-V semiconductor material of the substrate 402 is at least one of InP, InGaAs(P), and GaAs. The PID 400A includes first and second reflective structures 404 and 406, a common waveguide 408, multiple semiconductor waveguides 410, of which first through fourth semiconductor waveguides 410a-410d are being shown, and a dielectric waveguide based wavelength dependent element 412. The dielectric waveguide based wavelength dependent element 412 includes a dielectric waveguide 414 and a grating element 416. In an embodiment, the grating element 416 is an echelle grating. The common waveguide 408 and the first through fourth semiconductor waveguides 410a-410d are formed on the substrate 402.

The first and second reflective structures 404 and 406 have first and second predetermined reflectivities, and are formed adjacent to the common waveguide 408 and the semiconductor waveguides 410, respectively. The dielectric waveguide based wavelength dependent element 412 is formed on first regions of the substrate 402, the common waveguide 408 and the semiconductor waveguides 410. The PID 400A further includes first through fourth active gain regions disposed between the first and second reflective structures 404 and 406. The first through fourth active gain regions include first through fourth active structures 418a-418d that are disposed on predetermined regions of the first through fourth semiconductor waveguides 410a-410d, respectively.

The first and second reflective structures 404 and 406 provide an optical cavity for the first through fourth active gain regions. Each active structure 418 lases at a wavelength that is determined by the design of the dielectric waveguide based wavelength dependent element 412.

The first reflective structure 404 is at least one of $TiO_2$—$SiO_2$ stack, $Al_2O_3$—Si stack, $Al_2O_3$—$SiO_2$ stack, TaO—$SiO_2$ stack, SiN stack, and SiON stack. The second reflective structure 406 is a mirror facet, i.e., a non-wavelength dependent reflector and hence provides high amount of reflection as compared to the first reflective structure 404. Thus, the second predetermined reflectivity is greater than the first predetermined reflectivity. Further, the PID 400A includes first through fourth active structures 418a-418d that are disposed on the first through fourth semiconductor waveguides 410a-410d, respectively. Accordingly, the first through fourth active structures 418a-418d may be electrically controlled through their corresponding injection currents to lase either individually or in combinations at a respective predetermined wavelength such that a laser output from each active structure 418 is multiplexed and outputted through the first reflective structure 404.

In another embodiment, the PID 400B includes the first and second reflective structures 404 and 406, the common waveguide 408, the semiconductor waveguides 410, and the dielectric waveguide based wavelength dependent element 412. The dielectric waveguide based wavelength dependent element 412 includes the dielectric waveguide 414 and the grating element 416. The first reflective structure 404 is a mirror facet, i.e., a non-wavelength dependent reflector, and the second reflective structure 406 is at least one of $TiO_2$—$SiO_2$ stack, $Al_2O_3$—Si stack, $Al_2O_3$—$SiO_2$ stack, TaO—$SiO_2$ stack, SiN stack, and SiON stack. Thus, the first predetermined reflectivity is greater than the second predetermined reflectivity. The PID 400B includes an active structure 418 that is disposed on the common waveguide 408. Accordingly, in this configuration, when the active structure 418 receives an electrical current, the active structure 418 generates an optical signal having multiple wavelengths. The dielectric waveguide based wavelength dependent element 412 provides a wavelength dependent loss to the wavelengths of the optical signal and generates multiple optical output signals such that each optical output signal has a corresponding predetermined wavelength. The first through fourth semiconductor waveguides 410a-410d receive and output a corresponding output optical signal through the second reflective structure 406.

When the dielectric waveguide 414 within the dielectric waveguide based wavelength dependent element 412 is formed from a semiconductor, e.g. indium phosphide (InP), the approximate wavelength shift with temperature for an Echelle grating is given by Equation (1):

$$\frac{d\lambda}{dT} \approx \frac{\alpha\lambda}{n} \quad (1)$$

where α is the temperature dependence coefficient of a refractive index of the dielectric waveguide 414, λ is the operating wavelength, and n is the refractive index. Referring to Table 1 the refractive index and its temperature dependence are presented for indium phosphide (InP), silicon dioxide (silica, $SiO_2$), silicon nitride ($Si_3N_4$), and aluminum nitride (AlN) with a polymer coating. Accordingly, over a 70° C. operating range, an optical emitter without any temperature control that is exploiting an InP Echelle grating would shift ~6 nm or ~8/~15 channels at 100 GHz/50 GHz respectively. However, the same InP optical emitter with a silica Echelle grating will only shift ~0.70 nm or ~1/~2 channels at 100 GHz/50 GHz.

TABLE 1

Temperature dependence of InP and Dielectric waveguide materials

| Material | Refractive Index 'n' ($\lambda$ = 1550 nm) | dn/dT (1/° C.) | d$\lambda$/dT (nm/° C.) ($\lambda$ = 1310 nm) | d$\lambda$ (0° C.-70° C.) ($\lambda$ = 1310 nm) | d$\lambda$/dT (nm/° C.) ($\lambda$ = 1550 nm) |
|---|---|---|---|---|---|
| InP | 3.48 | ≈2.3 × $10^{-4}$ | 0.087 | 6.09 nm | 0.102 |
| $Si_3N_4$ | 2.05 | ≈4.0 × $10^{-5}$ | 0.026 | 1.82 nm | 0.030 |
| $SiO_2$ | 1.46 | ≈1.1 × $10^{-5}$ | 0.010 | 0.70 nm | 0.012 |
| AlN | 2.10 | ≈2.32 × $10^{-5}$ | 0.014 | 0.98 nm | 0.017 |
| Fluorinated Polymer | 1.38 | ≈−2.65 × $10^{-4}$ | −0.252 | −17.64 nm | −0.298 |

Figure 5:
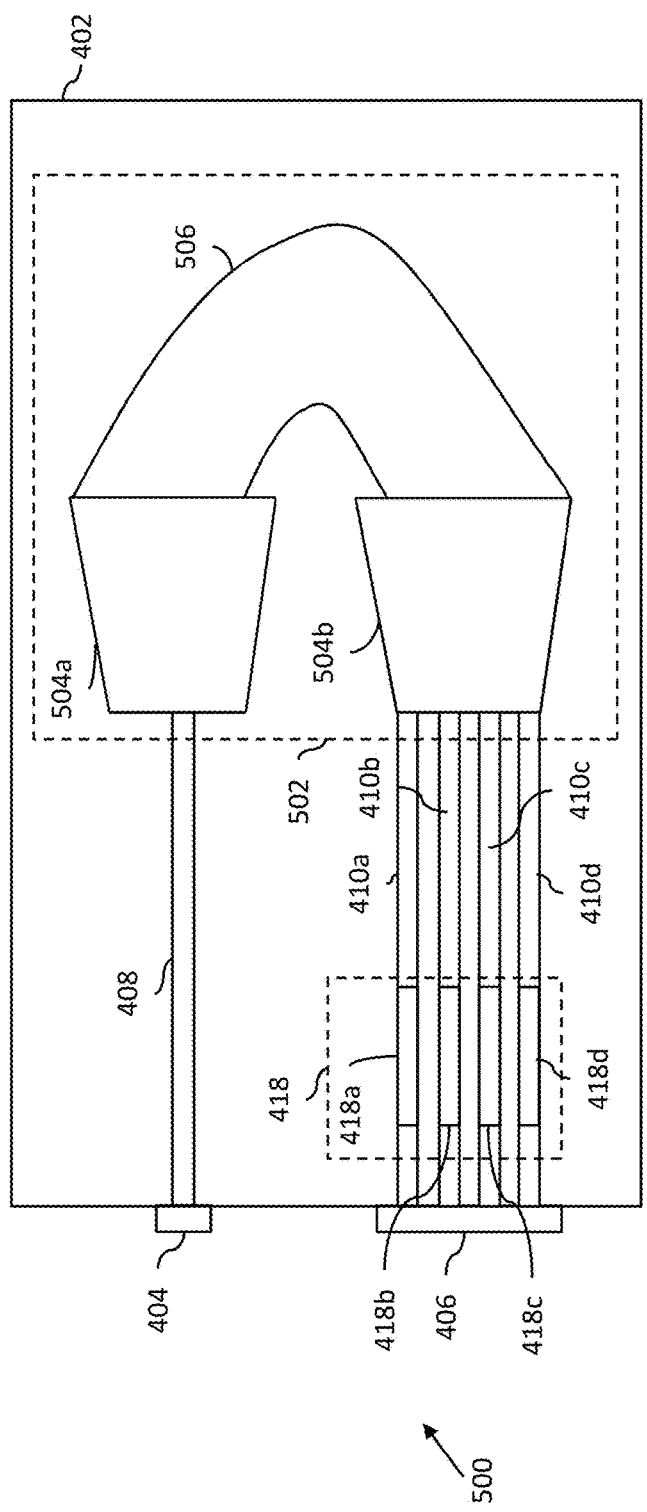
FIG. 5 is a schematic of a PID according to another embodiment of the present invention.

Referring now to FIG. 5, a PID 500 in accordance with another embodiment of the present invention is shown. The PID 500 includes the first and second reflective structures 404 and 406, the common waveguide 408, the semiconductor waveguides 410, of which the first through fourth semiconductor waveguides 410a-410d are being shown, and a dielectric waveguide based wavelength dependent element 502. The dielectric waveguide based wavelength dependent element 502 includes first and second dielectric waveguides 504a and 504b, and multiple arrayed waveguides 506. The first dielectric waveguide 504a is formed on first regions of the common waveguide 408 and the substrate 402, and the second dielectric waveguide 504b is formed on second regions of the semiconductor waveguides 410 and the substrate 402. The arrayed waveguides 506 are connected to each of the first and second dielectric waveguides 504a and 504b. Each arrayed waveguide 506 has a corresponding optical length such that each arrayed waveguide 506 applies a corresponding phase shift to an optical signal propagating through it. It will be understood by those of skill in the art that the grating elements 416 and 506 are not restricted to use of the echelle and arrayed waveguide gratings, any kind of gratings can be used to multiplex or diffract the optical signals. In another embodiment, the PIDs 400A, 400B, and 500 can be implemented using GaAs based materials.

It would be evident to a person skilled in the art that the PIDs 400A and 400B, and the PID 500, may include reflectors, filters, laser sources, optical fiber interfaces, optical fiber coupling optics, isolators, photodetectors, wavelength lockers, control circuits, thermoelectric elements, heater elements, direct modulation drive circuits, external modulators, and external modulator drive circuits.

Figure 6:
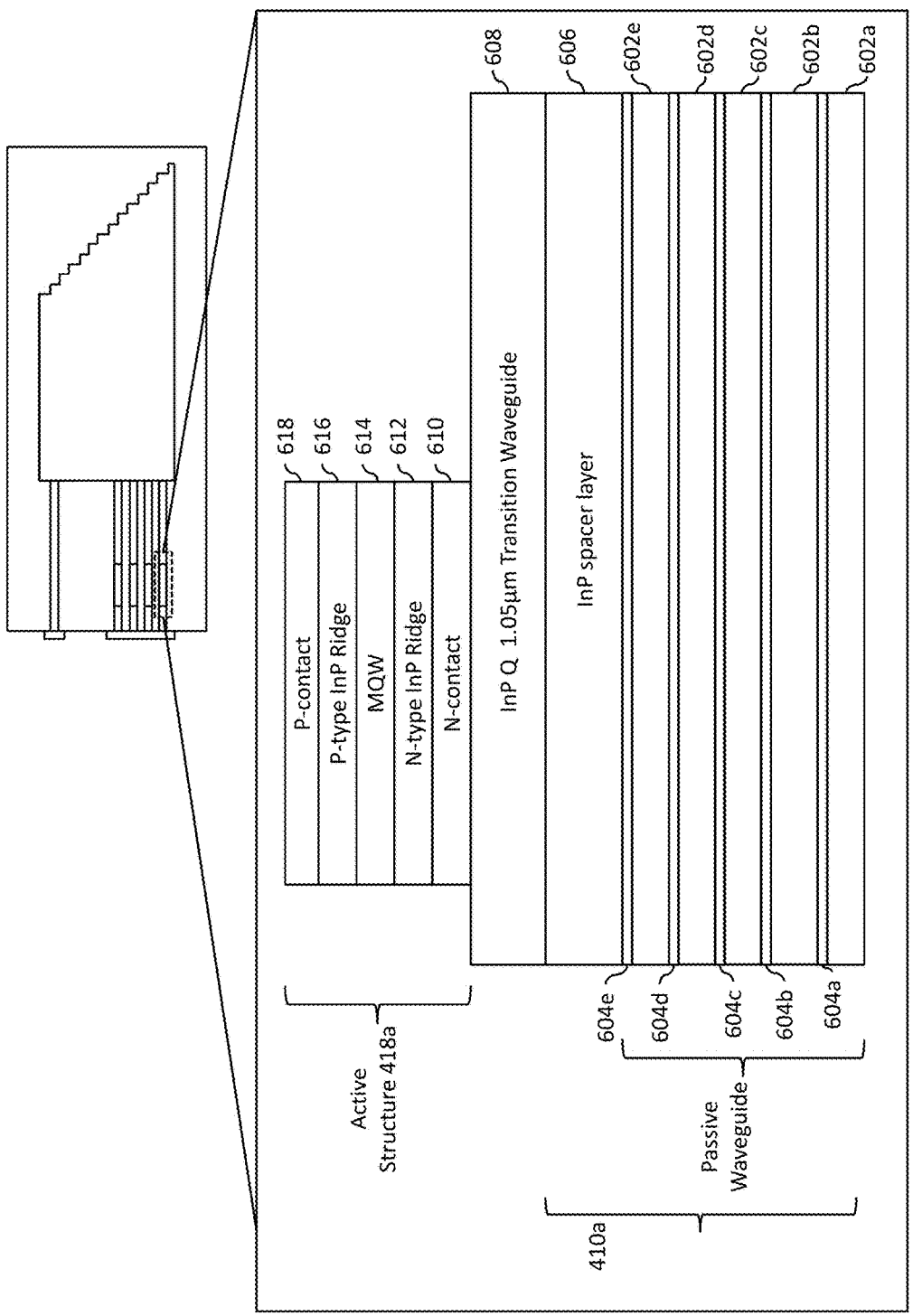
FIG. 6 is a cross sectional view of the PID of FIG. 4 according to an embodiment of the present invention.

Referring now to FIG. 6, a cross sectional view of the first active gain region that includes the first active structure 418a and the first semiconductor waveguide 410a in accordance with an embodiment of the present invention is shown. An epitaxial structure is grown on the substrate 402 that includes a passive waveguide structure. The first semiconductor waveguide 410a is formed using the passive waveguide structure that is formed using multiple alternating layers of a III-V compound semiconductor layer 602 and etch stop layers 604. In an embodiment, first through fifth III-V compound semiconductor layers 602a-602e and first through fifth etch stop layers 604a-604e are shown. The first semiconductor waveguide 410a further includes an InP spacer layer 606. The InP spacer layer 606 is formed on the passive waveguide structure. The common waveguide 408 is structurally similar to the first semiconductor waveguide 410a. Further, the second through fourth semiconductor waveguides 410b-410d are structurally and functionally similar to the first semiconductor waveguide 410a. The epitaxial structure further includes an InP Q 1.05 μm transition waveguide 608. The InP Q 1.05 μm transition waveguide 608 is formed on the InP spacer layer 606. The first active structure 418a includes an n-contact layer 610, an n-type ridge layer 612, multiple quantum well (MQW) layers 614, a p-type InP ridge layer 616, and a p-contact layer 618. In operation, when the first active structure 418a receives an electrical signal, the first active structure 418a generates an optical signal that is evanescently coupled to the InP Q 1.05 μm transition waveguide 608. The optical signal is further coupled to the dielectric waveguide based wavelength dependent element 412. The second through fourth active structures 418b-418d are structurally and functionally similar to the first active structure 418a.

Figure 7:
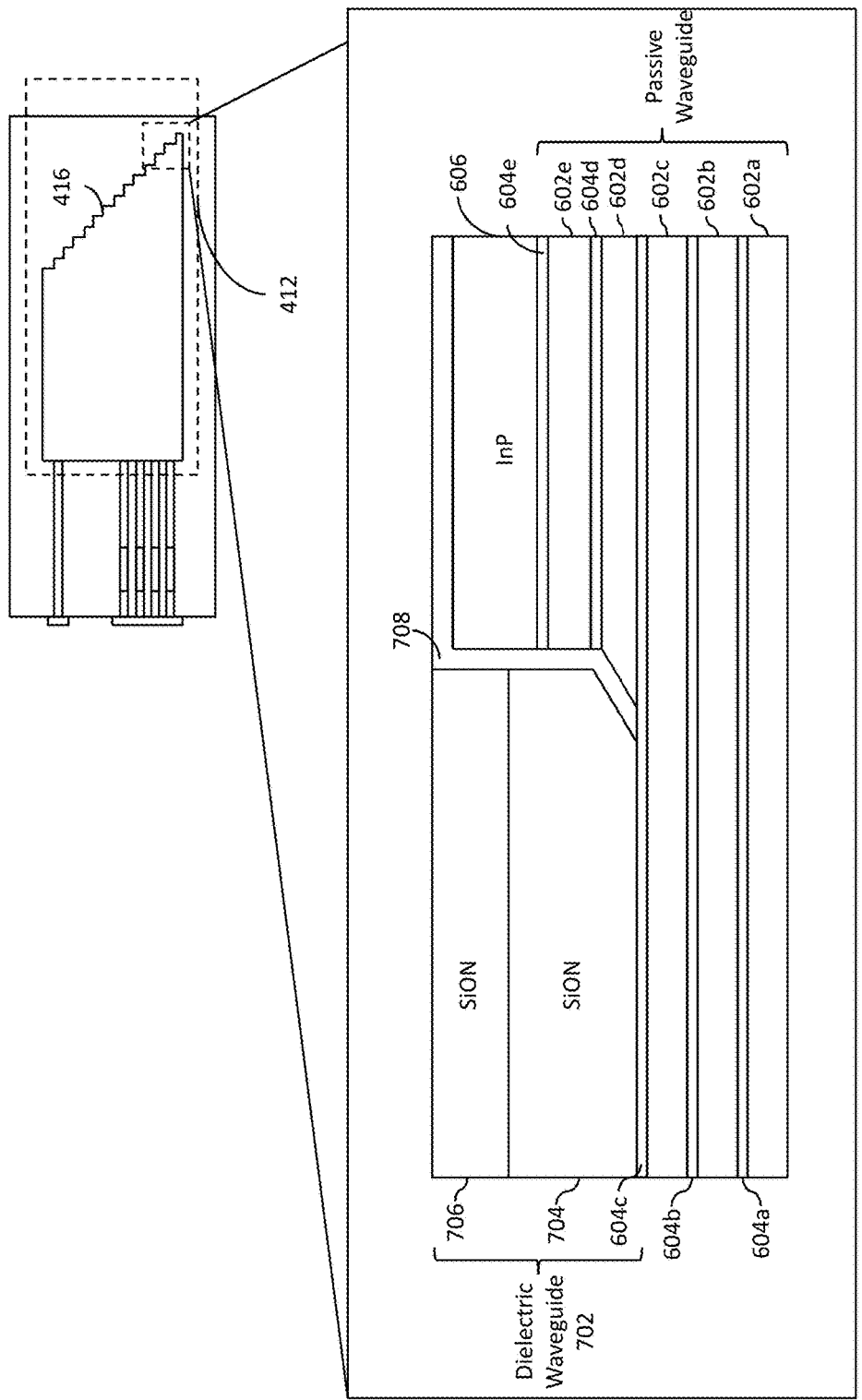
FIG. 7 is a cross sectional view of the dielectric waveguide based wavelength dependent element of the FIG. 4 according to an embodiment of the present invention.

Referring now to FIG. 7, a cross sectional view of the dielectric waveguide based wavelength dependent element 412 in accordance with an embodiment of the present invention is shown. The dielectric waveguide based wavelength dependent element 412 includes a dielectric waveguide 702 that is formed by etching the passive waveguide structure to a predetermined depth. In an embodiment, the passive waveguide structure is etched till the third etch stop layer 604c and the dielectric waveguide 702 is re-grown in the etched portion of the passive waveguide structure such that one end of the etched portion forms the grating element 416. The dielectric waveguide 702 includes first and second dielectric layers 704 and 706. The first dielectric layer 704 is an SiON (N=1.95) layer and the second dielectric layer 706 is an SiON (N=1.45) layer, where 'N' is refractive index. In the embodiment, a metal layer 708 with a very high reflectivity, i.e. greater than 95%, is deposited on first and second sides of the grating element 416 prior to the re-growth of the dielectric waveguide 702.

Figure 8:
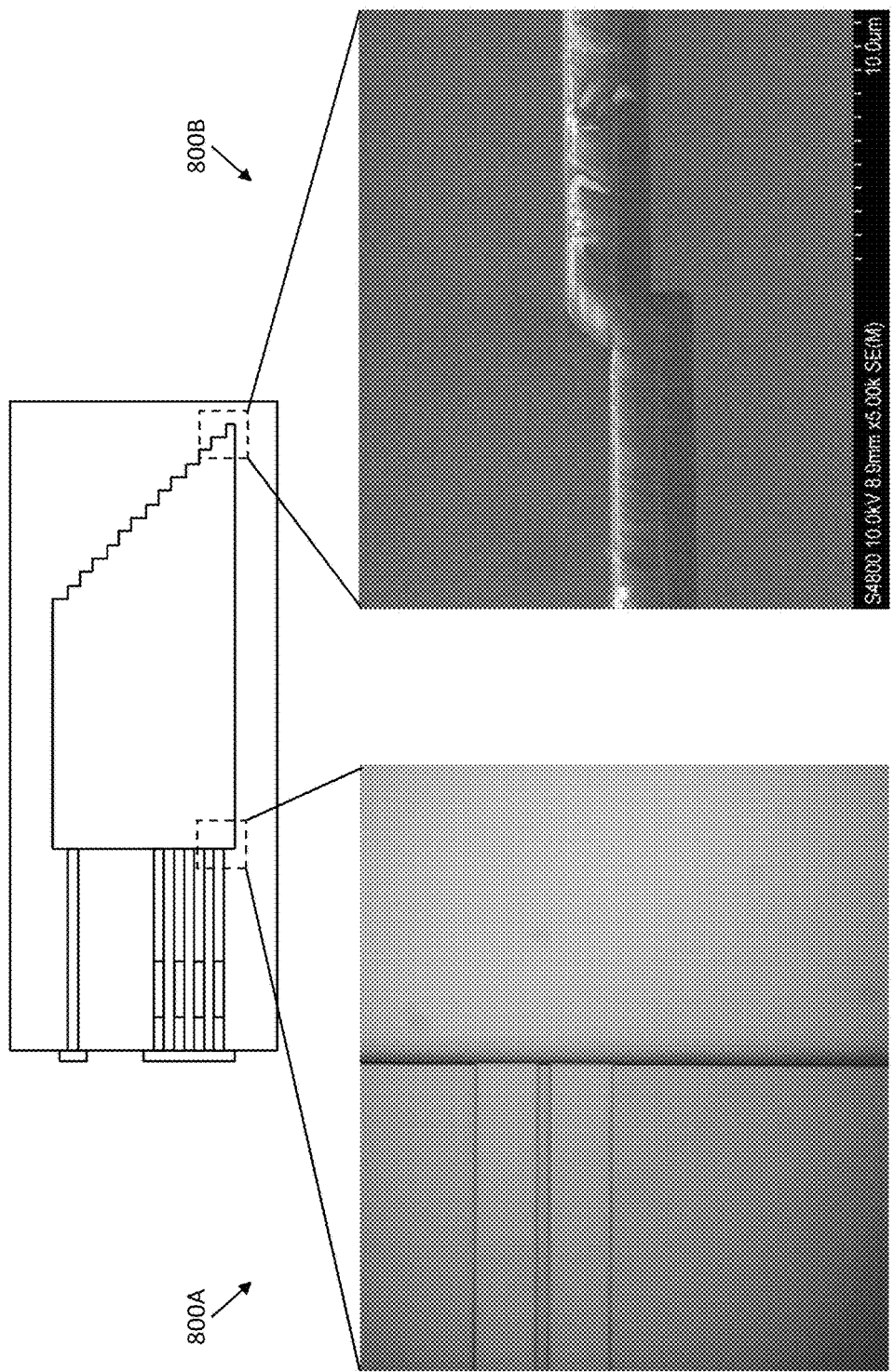
FIG. 8 depicts a first optical micrograph image of transition from a semiconductor waveguide to the dielectric waveguide and a second optical micrograph image of transition from the dielectric waveguide to a grating element of the FIG. 4, according to an embodiment of the present invention.

Referring now to FIG. 8, a first optical micrograph image 800A depicting a transition from the common waveguide 408 and the semiconductor waveguides 410 to the dielectric waveguide 414, and a second optical micrograph image 800B depicting a transition from the dielectric waveguide 414 to the grating element 416 in accordance with an embodiment of the present invention are shown. The first optical micrograph image 800A is a plan view of the fourth semiconductor waveguide 410d that is optically coupled to the dielectric waveguide 414. The second optical micrograph image 800B is a cross-sectional view of an interface between the dielectric waveguide 414 and the grating element 416.

Figure 9:
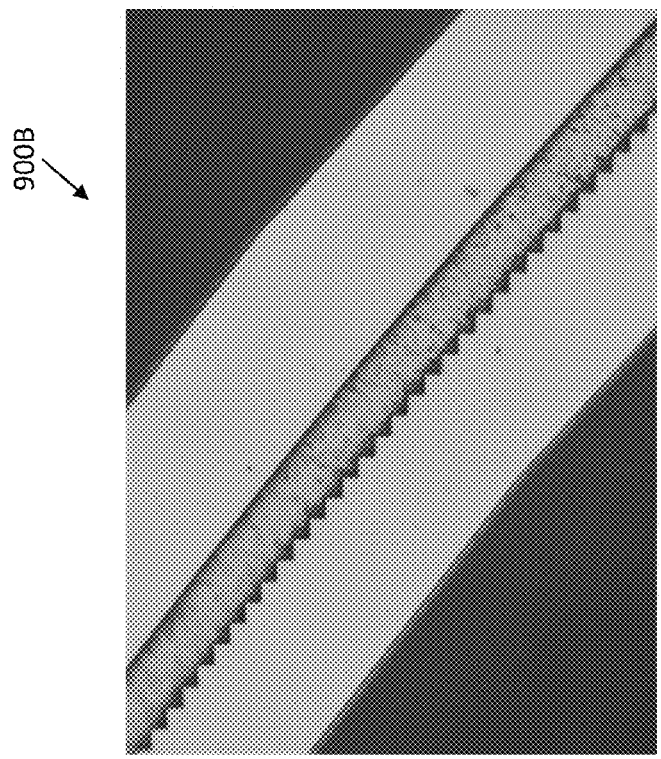
FIG. 9 depicts third and fourth optical micrograph images of the PID and the dielectric waveguide based wavelength dependent element of the FIG. 4, respectively, according to an embodiment of the present invention.
Figure 9:
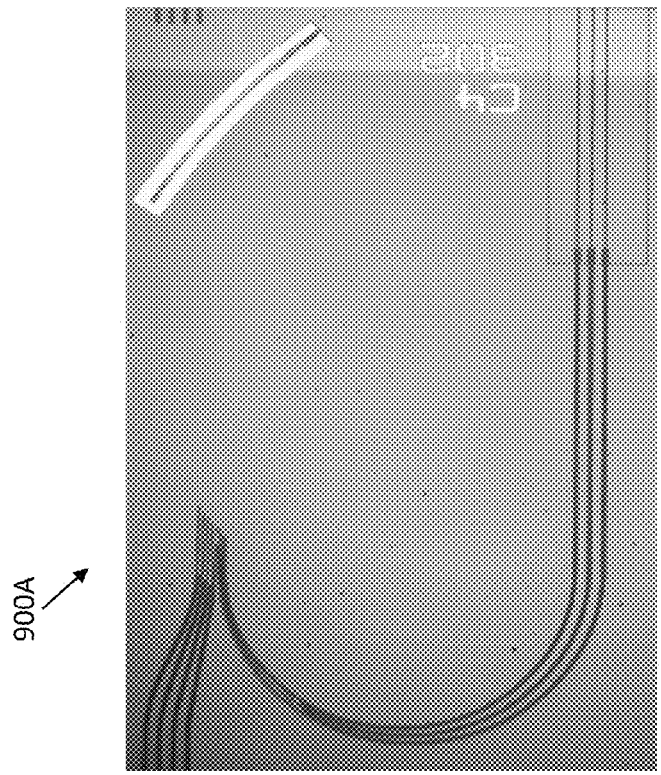

Referring now to FIG. 9, third and fourth optical micrograph images 900A and 900B depicting the PID 400A and the grating element 416, respectively, in accordance with an embodiment of the present invention are shown. The third optical micrograph image 900A depicts a plan view of the PID 400A with the dielectric waveguide 414 that is coupled to the grating element 416. In this embodiment, the grating element 416 is an echelle grating. The fourth optical micrograph image 900B depicts the echelle grating 416.

Within the embodiments of the invention described with respect to FIG. 4, the optical cavity of each of the PIDs 400A and 400B includes an electro-absorption modulator (not shown) to modulate the intensity of optical signals propagating through the optical cavity. In the embodiment, the electro-absorption modulator is a Mach-Zehnder modulator. The electro-absorption modulator modulates the output optical signal propagating through the common waveguide 408. The electro-absorption modulator further modulates the input optical signals propagating through the semiconductor waveguides 410.

Referring now to FIG. 10A, a schematic of a PID 1000 exploiting a dielectric Bragg stack 1002 in accordance with an embodiment of the present invention is shown. In an embodiment, the PID 1000 is a semiconductor optical emitter (SOE) 1000. The dielectric Bragg stack 1002 is coated on an upper surface and a first facet of the SOE 1000. The dielectric Bragg stack 1002 includes multi-layer dielectric coatings for producing a high finesse in the SOE 1000. The dielectric Bragg stack 1002 is formed using low stress dielectric materials such as $SiO_{X1}N_{Y1}/SiO_{X2}N_{Y2}$. In one embodiment, the dielectric Bragg stack 1002 has a thickness of $\lambda/4$. The dielectric Bragg stack 1002 may be employed in ridge and buried heterostructure laser geometries. Further, it can be integrated within the PIDs 400A and 400B through selective deposition and etch and re-deposition processes.

The SOE 1000 is formed on a substrate 1004, and includes MQW layers 1006 and an overgrowth structure 1008. In present embodiment, the substrate 1004 is formed using a III-V semiconductor material. In an example, the III-V semiconductor material of the substrate 1004 is at least one of InP, InGaAs(P), and GaAs. The overgrowth structure 1008 is at least one of a ridge and buried heterostructures. A reflector 1010, i.e., a broadband mirror 1010 is formed on a second facet of the SOE 1000. In one embodiment, the reflector 1010 is formed using a metallic based mirror. The reflector 1010 is deposited and patterned prior to formation of the dielectric Bragg stack 1002. In another embodiment, the broadband mirror 1010 is formed by at least one of cleaved facets, an etched facet to air, and an etched facet to a dielectric material.

Referring now to FIG. 10B, a top view of the SOE 1000 in accordance with an embodiment of the present invention is shown. The top view of the SOE 1000 shows a FP laser cavity 1012 sandwiched between the dielectric Bragg stack 1002 and the reflector 1010. An optical length of the FP laser cavity 1012 is $m_{FP}\lambda$, where $m_{FP}$ is an integer, i.e., $m_{FP}=600$ or $m_{FP}=1200$. Accordingly, the physical length of the FP laser cavity 1012 is $L=m_{FP}\lambda/n$, where for $n=3.22$ at $\lambda2=1.3$ μm and $m_{FP}=600$; 1200, L=242 μm and L=484 μm, respectively. Thus at a predetermined wavelength, i.e., $\lambda=1.3$ μm, the SOE 1000 provides a peak transmittance. In presently preferred embodiment, the dielectric Bragg stack 1002 has an alternating stack of first and second dielectric layers 1014 and 1016 with first and second refractive indices $n_1$ and $n_2$, respectively. The dielectric Bragg stack 1002 further includes a Bragg phase shift layer 1018 that is deposited at a predetermined region of the dielectric Bragg stack 1002. The dielectric Bragg stack 1002 has thickness of $m_{PHASE}\lambda$ where m=N+0.5; N=0, 1, . . . 4, 5. In presently preferred embodiment, the Bragg phase shift layer 1018 has the second refractive index $n_2$ and is positioned at the center of the dielectric Bragg stack 1002. The metal reflector 1010 includes a metal layer 1020 and a single layer dielectric 1022.

Figure 11:
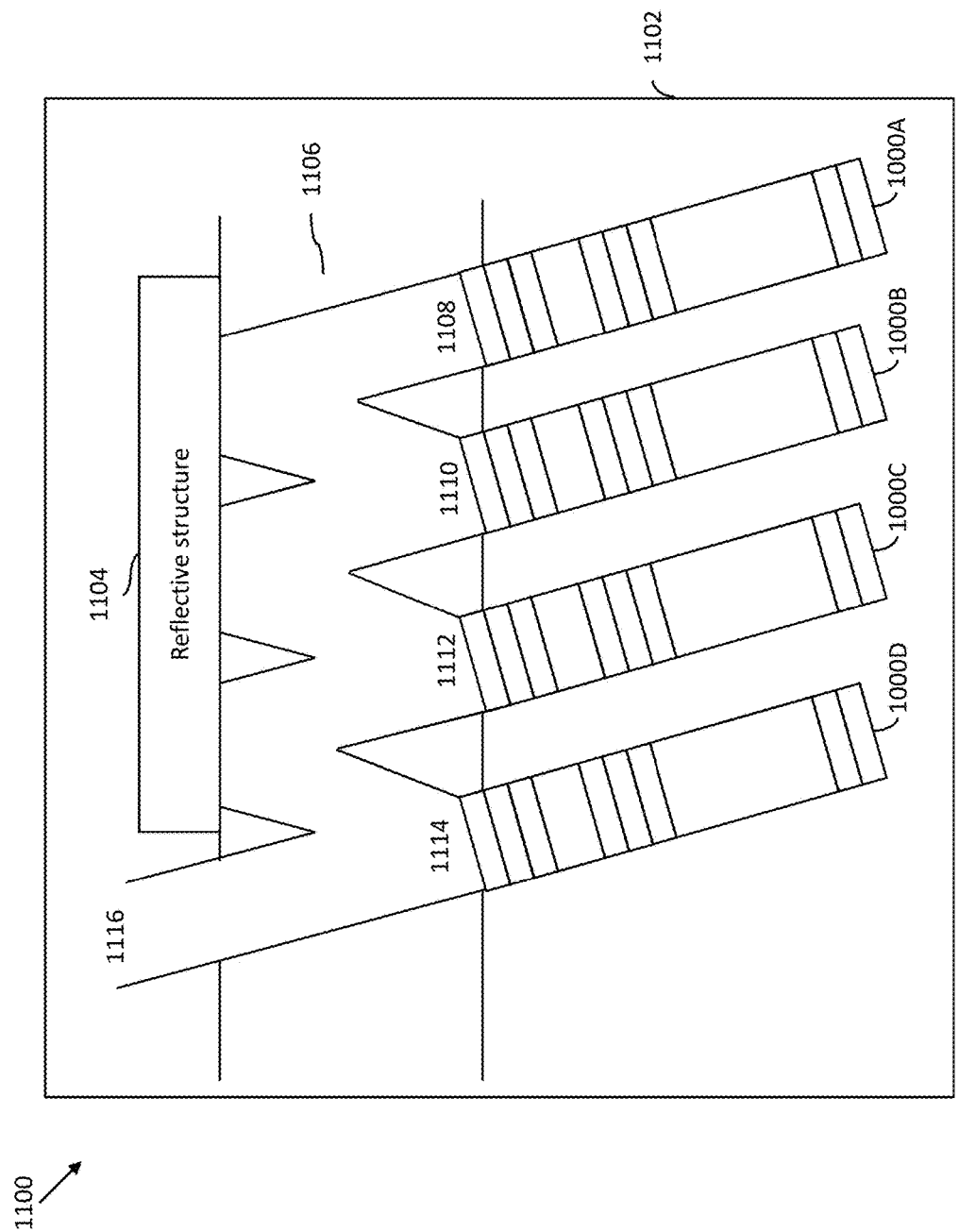
FIG. 11 is a schematic of a PID exploiting multiple SOEs of FIG. 10A according to another embodiment of the present invention.

Referring now to FIG. 11, a PID 1100 exploiting multiple SOEs 1000 in a "zig-zag" configuration in accordance with an embodiment of the present invention is shown. The PID 1100 is grown on a substrate 1102. In present embodiment, the substrate 1102 is formed using a III-V semiconductor material. In an example, the III-V semiconductor material is at least one of InP, InGaAs(P), and GaAs. In present embodiment, the first through fourth SOEs 1000A-1000D are shown. The PID 1100 further includes a reflective structure 1104 and a dielectric waveguide 1106. The reflective structure 1104 is spaced apart and formed in front of first facets of the first through fourth SOEs 1000A-1000D. The reflector 1010 provides peak reflectivity of 99% at multiple wavelengths of the optical signal. In the present embodiment, the reflective structure 1104 is formed using metals such as gold, titanium, germanium, platinum, nickel, and combinations thereof. The dielectric waveguide 1106 is deposited between the reflective structure 1104 and the first through fourth SOEs 1000A-1000D. In one embodiment, the first through fourth SOEs 1000A-1000D generate first through fourth optical signals 1108-1114 having first through fourth wavelengths, respectively. The first optical signal 1108 propagates through the dielectric waveguide 1106 and incident on the reflective structure 1104. The first optical signal 1108 is reflected by the reflective structure 1104. The reflected first optical signal 1108 propagates through the dielectric waveguide 1106 and incident on the second SOE 1000B. The second SOE 1000B generates the second optical signal 1110 that is multiplexed with the first optical signal 1108, thereby generating a first multiplexed optical signal, which is incident on the reflective structure 1104. The first multiplexed optical signal propagates through the dielectric waveguide 1106 and incident on the third SOE 1000C. Similarly, the third and fourth SOEs 1000C and 1000D multiplex the third and fourth optical signals 1112 and 1114 with the first multiplexed optical signal. The PID 1100 outputs an output optical signal 1116 which is a multiplexed version of first through fourth optical signals 1108-1114 having the first through fourth wavelengths, respectively.

In another embodiment, the first through fourth SOEs 1000A-1000D detect the first through fourth optical signals 1108-1114 having first through fourth wavelengths, respectively. An input beam 1116 having first through fourth wavelengths propagates through the dielectric waveguide 1106 and incident on the fourth SOE 1000D. The fourth SOE 1000D detects the fourth optical signal 1114, and reflects the input beam 1116 having the first through third wavelengths. The input beam 1116 propagates through the dielectric waveguide 1106 and is incident on the third SOE 1000C that separates the third optical signal 1112 and transmits the input beam 1116 having the first and second wavelengths. Similarly, the second and first SOEs 1000B and 1000A separate the second and first optical signals 1110 and 1108, respectively.

Figures 12A, 12B:
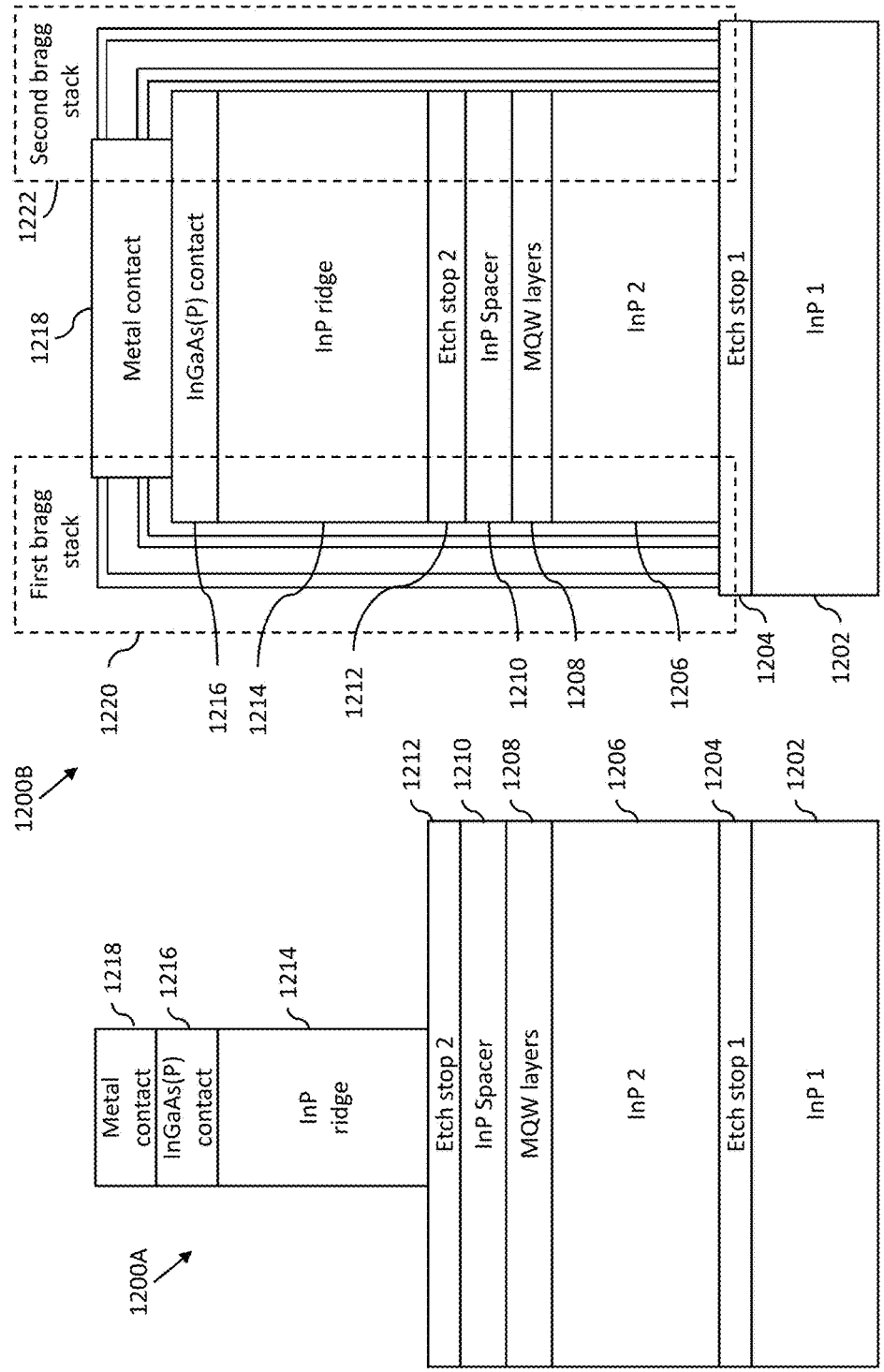
FIG. 12A is a lateral cross-sectional view of the SOE according to another embodiment of the present invention.
FIG. 12B is a longitudinal cross-sectional view of the SOE according to another embodiment of the present invention.

Referring now to FIG. 12A, a lateral cross-sectional view 1200A of the SOE 1000 in accordance with an embodiment of the present invention is shown. The SOE 1000 includes an active structure that includes a first semiconductor layer 1202, a first etch stop layer 1204, a second semiconductor layer 1206, MQW layers 1208, an InP spacer layer 1210, a second etch stop layer 1212, an InP ridge layer 1214, an InGaAs(P) contact layer 1216, and a metal contact layer 1218. The first etch stop layer 1204 is formed on the first semiconductor layer 1202. In one embodiment, the first etch stop layer 1204 is replaced by a wafer bonding layer which is a metal layer. By using the wafer bonding layer, the SOE 1000 die can be wafer bonded to another die. The second semiconductor layer 1206 is formed on the first etch stop layer 1204. In presently preferred embodiment, the first and second semiconductor layers 1202 and 1206 are formed using a III-V compound semiconductor material. In the embodiment, the III-V semiconductor material is InP. The MQW layers 1208 are formed on the second semiconductor layer 1206. The InP spacer layer 1210 is formed on the MQW layers 1208, and the second etch stop layer 1212 is formed on the InP spacer layer 1210. The InP ridge layer 1214 is formed on the second etch stop layer 1212 and the InGaAs(P) contact layer 1216 is formed on the InP ridge layer 1214. The metal contact layer 1218 is formed on the InGaAs(P) contact layer 1216. The InP spacer layer 1210, the second etch stop layer 1212, the InP ridge layer 1214, the InGaAs(P) contact layer 1216, and the metal contact layer 1218 corresponds to the overgrowth structure 1008 of FIG. 10A. Further, the first and second semiconductor layers 1202 and 1206, the first and second etch stop layers 1204 and 1212, the InP spacer layer 1210, and the MQW layers 1208 define an active semiconductor waveguide. The InP ridge layer 1214, the InGaAs(P) contact layer 1216, and the metal contact layer 1218 form a ridge structure.

Referring now to FIG. 12B, a longitudinal cross-sectional view 1200B of the SOE 1000 that includes the active structure of FIG. 12A, in accordance with another embodiment of the present invention is shown. The SOE 1000 further includes first and second dielectric Bragg stacks 1220 and 1222. In one embodiment, each of the first and second dielectric Bragg stacks 1220 and 1222 has a thickness of $\lambda/4$. The active structure is etched down till the first etch stop layer 1204 to deposit the first and second dielectric Bragg stacks 1220 and 1222. Further, the first and second dielectric Bragg stacks 1220 and 1222 contact the first and second facets of the SOE 1000, respectively. In operation, when the metal contact layer 1218 receives an electrical signal, the MQW layers 1208 generate an optical signal. The optical signal propagates within the active semiconductor waveguide and is output from the first and second dielectric Bragg stacks 1220 and 1222. The first dielectric Bragg stack 1220 outputs the optical signal having a first wavelength and the second dielectric Bragg stack 1222 outputs the optical signal having a second wavelength.

Figure 13:
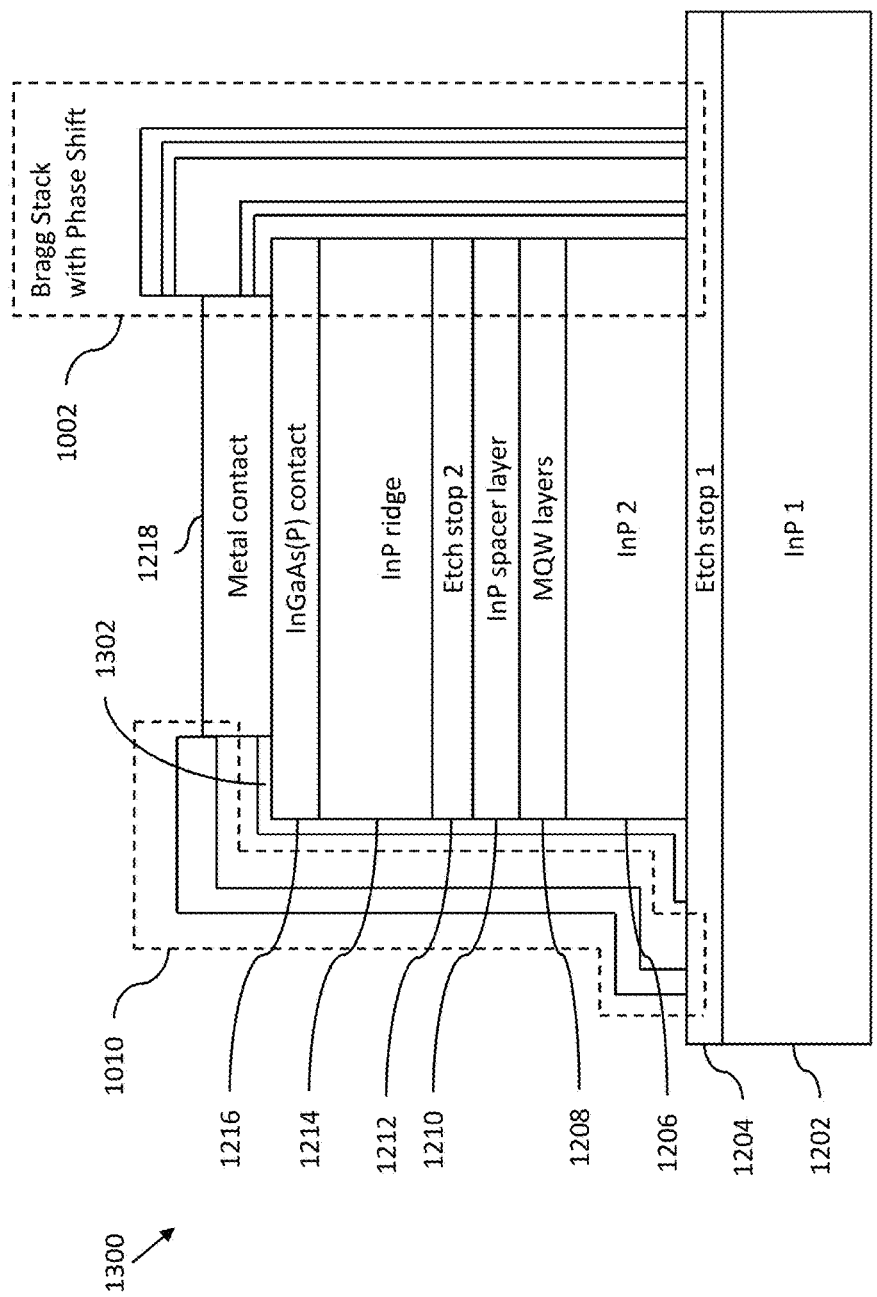
FIG. 13 is a longitudinal cross-sectional view of the SOE of the FIG. 10A according to another embodiment of the present invention.

Referring now to FIG. 13, a cross sectional view of a PID 1300 in accordance with another embodiment of the present invention is shown. The PID 1300 corresponds to the PID 1000 of FIG. 10. In the embodiment, the PID 1300 is an SOE 1300. The SOE 1300 is formed from an active structure that includes the first semiconductor layer 1202, the first etch stop layer 1204, the second semiconductor layer 1206, the MQW layers 1208, the InP spacer layer 1210, the second etch stop layer 1212, the InP ridge layer 1214, the InGaAs (P) contact layer 1216, and the metal contact layer 1218. The PID 1300 further includes the dielectric Bragg stack 1002 and the reflector 1010, and an anti-reflection layer 1302. The dielectric Bragg stack 1002 and the reflector 1010 are deposited on first and second facets of the SOE 1300, respectively. The anti-reflection layer 1302 is a dielectric layer that reduces an effect of thin film interference at the second facet of the SOE 1300. In one embodiment, the anti-reflection layer 1302 is deposited between the reflector 1010 and the second facet of the SOE 1300. In another embodiment, the anti-reflection layer 1302 is deposited between the dielectric Bragg stack 1002 and the first facet of the SOE 1300.

Figures 14A, 14B:
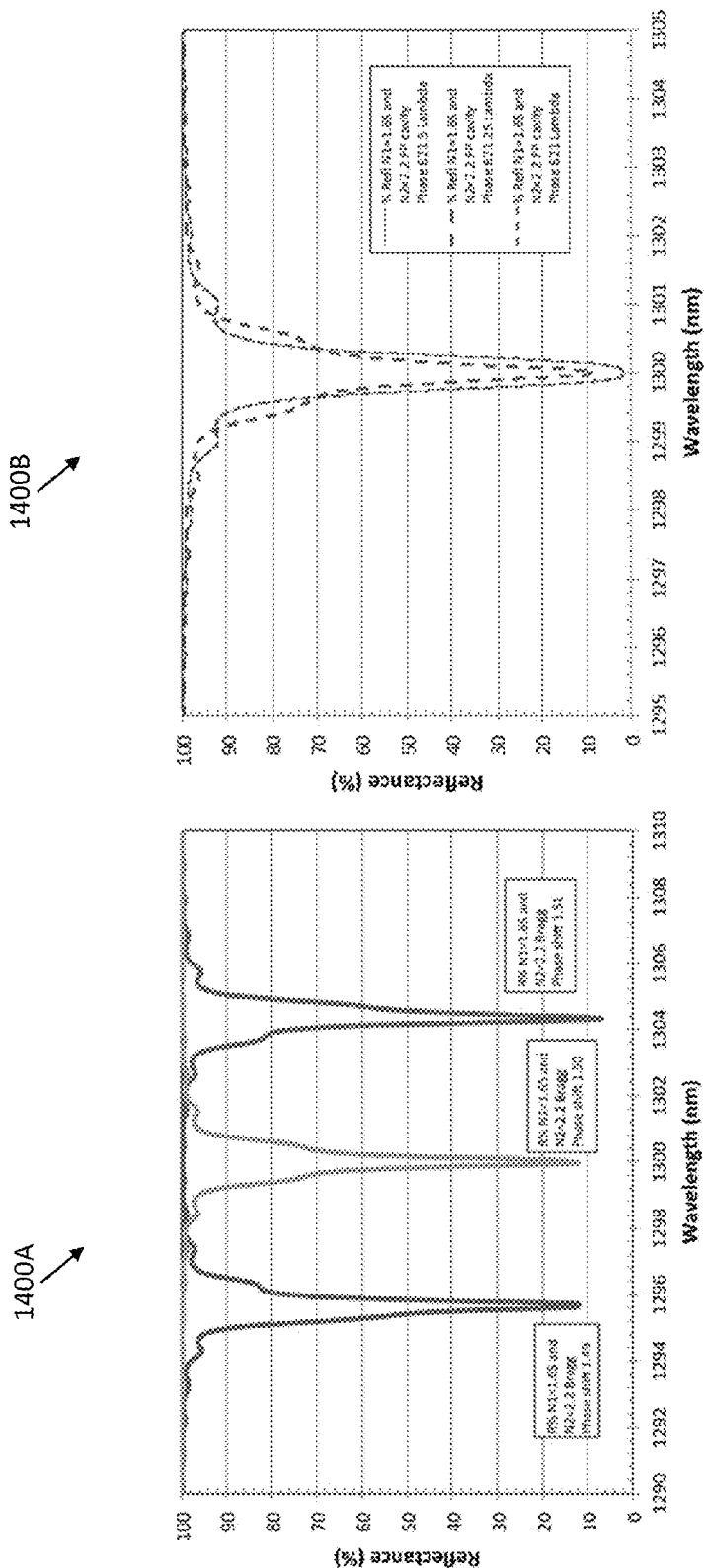
FIGS. 14A and 14B are graphs showing impact on a wavelength response of the SOE of the FIG. 10A due to a dielectric Bragg stack according to another embodiment of the present invention.

Referring now to FIG. 14A, the impact of the Bragg phase shift layer 1018 on a wavelength response of the SOE 1000 in accordance with an embodiment of the present invention is shown. The first dielectric layer 1014 has a refractive index of $n_1=1.65$ and the second dielectric layer 1016 has a refractive index of $n_2=2.2$. The graph 1400A shows a wavelength response of the SOE 1000 for the dielectric Bragg stacks 1002 with Bragg phase shifts of $m_{PHASE}=1.49$; 1.50; 1.51, respectively. For $\delta m_{PHASE}=\pm 0.1$, the wavelength shift is $\delta\lambda=\pm 4.4$ nm with a nominal centre wavelength of 1300 nm.

Referring now to FIG. 14B, a graph 1400B depicting the reduction in sensitivity of the SOE 1000 for generating the optical signal due to the FP laser cavity 1012 in accordance with an embodiment of the present invention is shown. The first and second dielectric layers 1014 and 1016 have refractive indices of 1.65 and 2.2, respectively. The first through third dielectric Bragg stacks 1002 are formed from the first and second dielectric layers 1014 and 1016, and the Bragg phase shift layer 1018. The first through third dielectric Bragg stacks 1002 have Bragg phase shifts of $m_{PHASE}=621.00$, 621.25, 621.50, respectively. Thus, from graph 1400B, it is seen that the centre wavelength is unchanged for change in the Bragg phase shift $\delta m_{PHASE}=0.25$.

Figure 15:
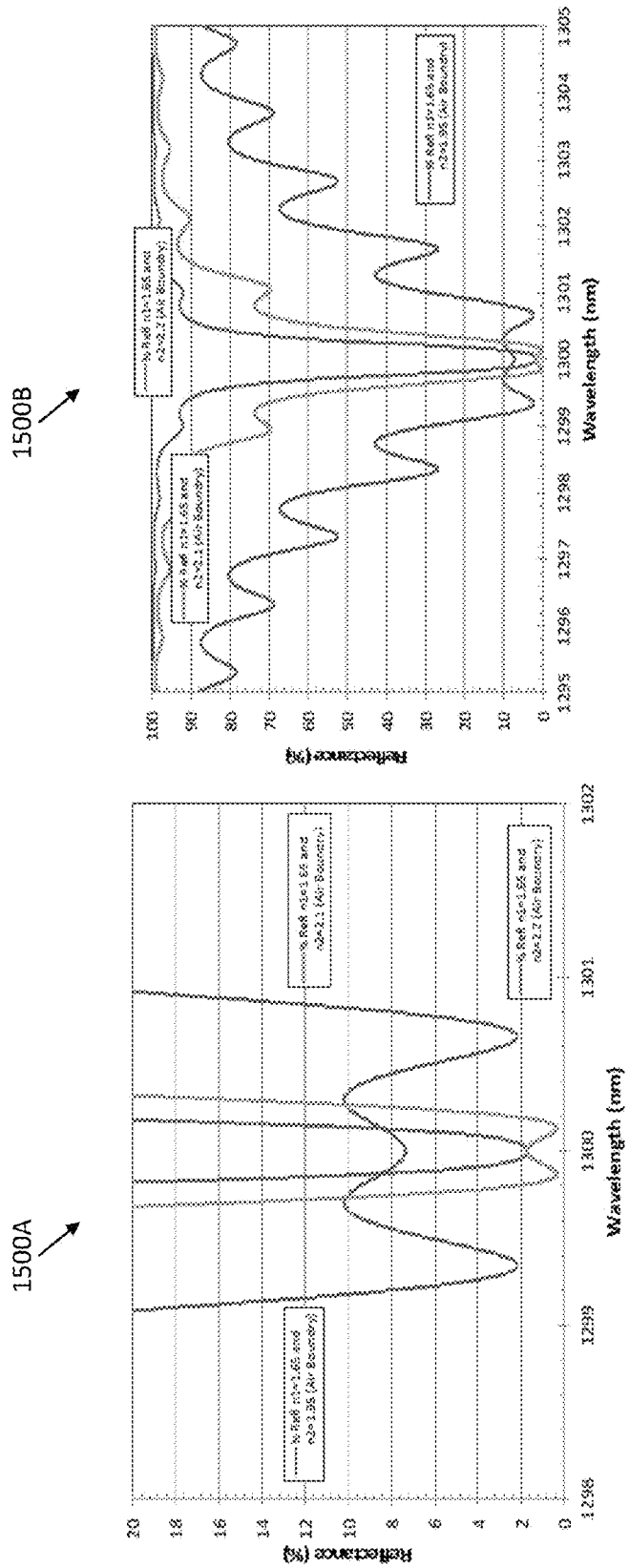
FIG. 15 shows graphs of an effect on a wavelength response of the SOE due to change in refractive indices of the dielectric Bragg stack of FIG. 10A according to another embodiment of the present invention.

Referring now to FIG. 15, effect on wavelength responses of the SOE 1000 due to change in a difference between the first and second refractive indices $n_1$ and $n_2$ in accordance with an embodiment of the present invention are shown. In graphs 1500A and 1500B the reflectance around the minimum is depicted for $\delta n=\overline{n_2-n_1}=0.30$; 0.45; 0.55, where the SOE 1000 employing the dielectric Bragg stack 1002 enables a single mode operation for a predetermined value, i.e., $\delta n \geq 0.55$ at an ambient temperature range of 0° C. to 70° C. Further when $\delta n \geq 0.75$, the SOE 1000 can be integrated with the dielectric waveguide 702.

Figure 16:
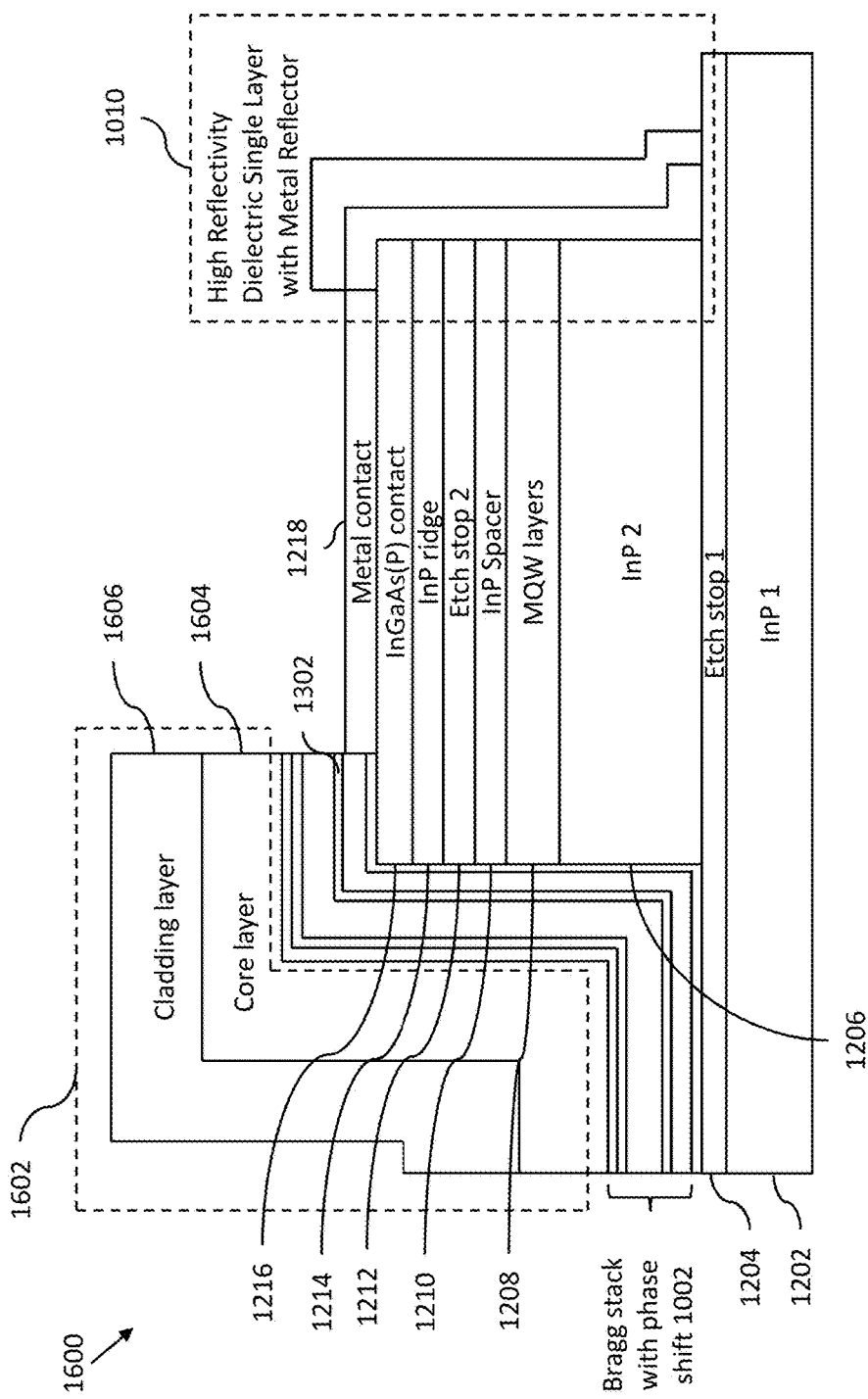
FIG. 16 is a longitudinal cross-sectional view of an integration of a dielectric PID waveguide with the SOE of FIG. 13 according to another embodiment of the present invention.

Referring now to FIG. 16, a cross-sectional view of a PID 1600 according to another embodiment of the present invention is shown. In an embodiment, the PID 1600 is an SOE 1600. The SOE 1600 includes an active structure that includes the first semiconductor layer 1202, the first etch stop layer 1204, the second semiconductor layer 1206, the MQW layers 1208, the InP spacer layer 1210, the second etch stop layer 1212, the InP ridge layer 1214, the InGaAs (P) contact layer 1216, the metal contact layer 1218, the dielectric Bragg stack 1002, the reflector 1010, and the anti-reflection layer 1302. The SOE 1600 further includes a dielectric PID waveguide 1602 that is formed adjacent to the dielectric Bragg stack 1002. The dielectric PID waveguide 1602 includes core and cladding layers 1604 and 1606. The core layer 1604 is a silicon oxynitride ($SiO_XN_Y$; n=1.95) layer that is deposited upon the dielectric Bragg stack 1002, and the cladding layer 1606 is a silicon oxynitride ($SiO_XN_Y$; n=1.75) layer that is deposited on the core layer 1604. The core and cladding layers 1604 and 1606 form a passive optical waveguide. In one embodiment, the passive optical waveguide receives an optical signal from the active structure by way of the dielectric Bragg stack 1002. In another embodiment, the passive optical waveguide provides an optical signal to the active structure by way of the dielectric Bragg stack 1002.

Figure 17:
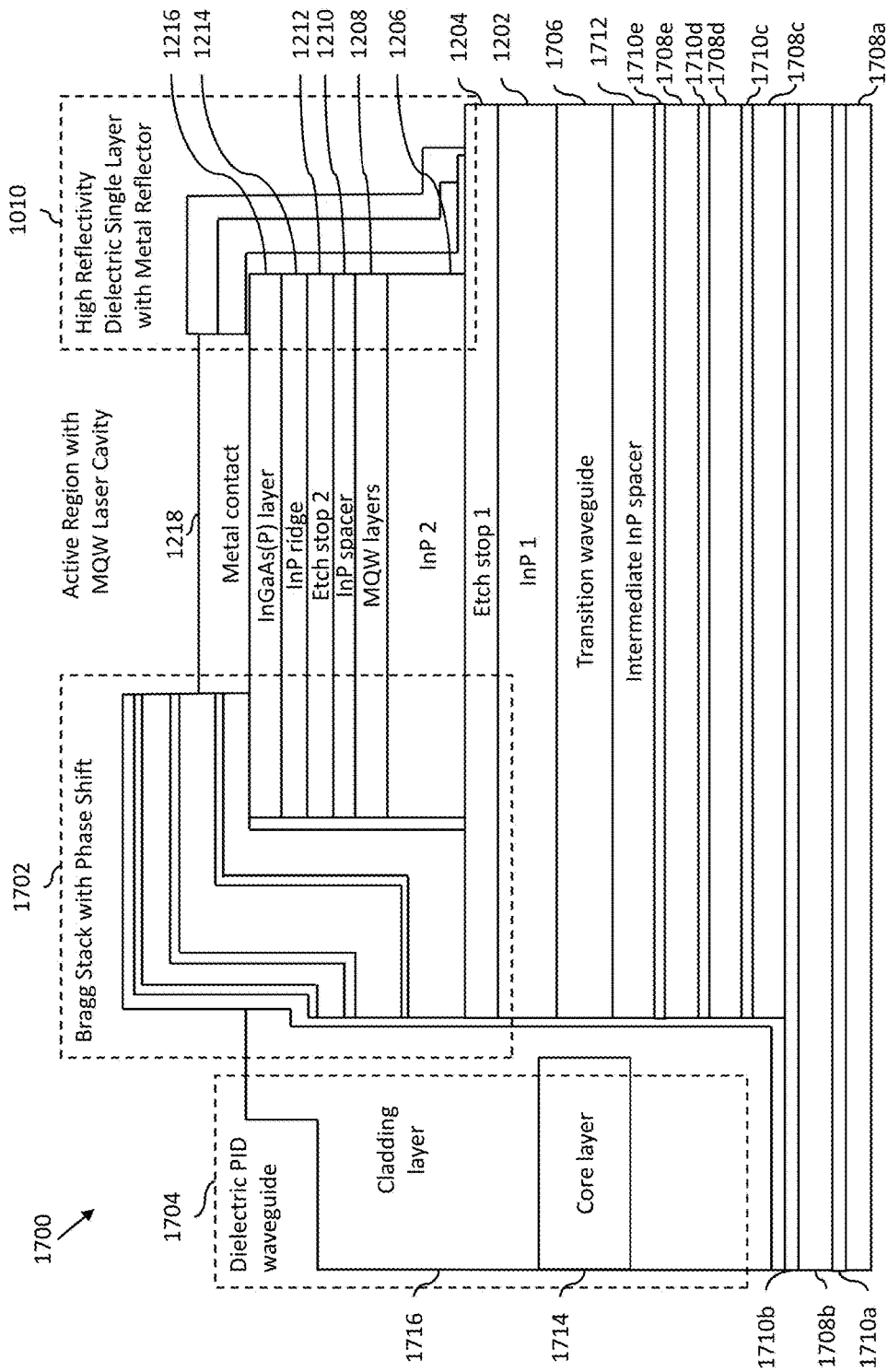
FIG. 17 is a longitudinal cross-sectional view of the SOE of FIG. 13 with dielectric Bragg stack interfaced to a dielectric PID waveguide via a transition waveguide according to another embodiment of the present invention.

Referring now to FIG. 17, a cross-sectional view of a PID 1700 with a dielectric Bragg stack 1702 interfaced to a dielectric PID waveguide 1704 via a transition waveguide 1706 in accordance with an embodiment of the present invention is shown. In an embodiment, the PID 1700 is an SOE 1700. The SOE 1700 includes a passive waveguide structure comprising multiple alternating layers of a III-V compound semiconductor layer 1708 and an etch stop layer 1710, of which first through fifth III-V compound semiconductor layers 1708a-1708e and first through fifth etch stop layers 1710a-1710e are shown. The SOE 1700 further includes an intermediate InP spacer layer 1712 and the transition waveguide 1706. The intermediate InP spacer layer 1712 is formed on the passive waveguide structure, and the transition waveguide 1706 is formed on the intermediate InP spacer layer 1712. The SOE 1700 further includes the reflector 1010 and an active structure formed on the transition waveguide 1706. The active structure includes the first semiconductor layer 1202, the first etch stop layer 1204, the second semiconductor layer 1206, the MQW layers 1208, the InP spacer layer 1210, the second etch stop layer 1212, the InP ridge layer 1214, the InGaAs(P) contact layer 1216, and the metal contact layer 1218. The dielectric PID waveguide 1704 includes a core layer 1714 and a cladding layer 1716. The core and cladding layers 1714 and 1716 are formed adjacent to the dielectric Bragg stack 1702. In an embodiment, the core layer 1714 is a silicon oxynitride ($SiO_xN_y$; n=1.95) layer that is deposited upon the dielectric Bragg stack 1702, and the cladding layer 1716 is a silicon oxynitride ($SiO_xN_y$; n=1.75) layer that is deposited on the core layer 1714. An optical signal generated by the active structure couples evanescently to the transition waveguide 1706 where it is butt-coupled to the dielectric PID waveguide 1704.

Figure 18A:
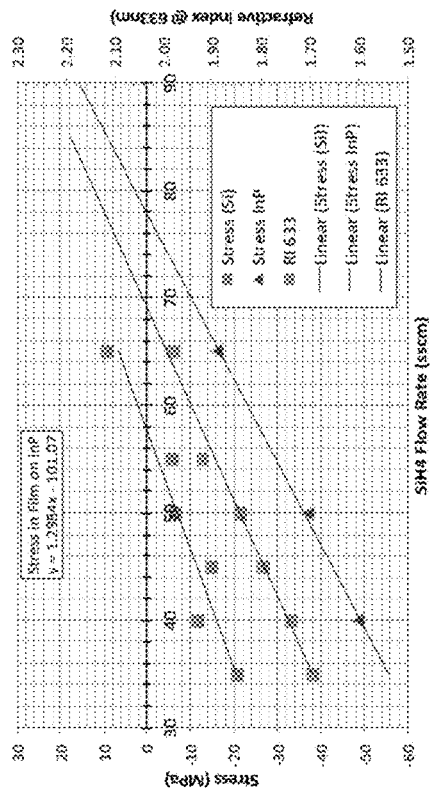
FIG. 18A is a graph showing variation in stress of the dielectric Bragg stack formed on the SOE according to another embodiment of the present invention.

Referring now to FIG. 18A, a graph 1800A depicting a variation in stress of silicon oxynitride of the dielectric Bragg stack 1002 upon silicon and indium phosphide layers of the SOE 1000 in accordance with an embodiment of the present invention is shown. Each stress in film on InP versus silane ($SiH_4$) flow rate crosses the zero stress axis enabling films with both positive and negative stress to be employed within the first and second dielectric layers 1014 and 1016 of the dielectric Bragg stack 1002 for the SOE 1000. Accordingly, due to the alternating dielectric films, the stress within the dielectric Bragg stack 1002 is reduced. Table 2 shows the design of the dielectric Bragg stack 1002. The final film stress is projected to be less than 40 MPa which is less in contrast with the prior art where the stress of an $SiO_2$ film on InP is typically 300 MPa to 400 MPa.

TABLE 2

| Dielectric Bragg Stack 1002 Design | | | | |
|---|---|---|---|---|
| Bragg Stack | Layer Thickness (nm) | $SiH_4$ Flow | Index @ 633 nm | Stress on InP | Average Stress |
| SiON | 156 | 85 | 2.1119 | 9.294 | 0.511 |
| SiON | 196 | 30 | 1.6169 | -62.118 | -4.295 |
| SiON | 156 | 85 | 2.1119 | 9.294 | 0.511 |
| SiON | 196 | 30 | 1.6169 | -62.118 | -4.295 |
| SiON | 156 | 85 | 2.1119 | 9.294 | 0.511 |
| SiON | 196 | 30 | 1.6169 | -62.118 | -4.295 |
| SiON | 156 | 85 | 2.1119 | 9.294 | 0.511 |
| SiON | 196 | 30 | 1.6169 | -62.118 | -4.295 |

TABLE 2-continued

| Dielectric Bragg Stack 1002 Design | | | | |
|---|---|---|---|---|
| Bragg Stack | Layer Thickness (nm) | $SiH_4$ Flow | Index @ 633 nm | Stress on InP | Average Stress |
| SiON | 175 | 85 | 2.1119 | 9.294 | 0.511 |
| SiON | 156 | 85 | 2.1119 | 9.294 | 0.511 |
| SiON | 196 | 30 | 1.6169 | -62.118 | -4.295 |
| SiON | 156 | 85 | 2.1119 | 9.294 | 0.511 |
| SiON | 196 | 30 | 1.6169 | -62.118 | -4.295 |
| SiON | 156 | 85 | 2.1119 | 9.294 | 0.511 |
| SiON | 196 | 30 | 1.6169 | -62.118 | -4.295 |
| SiON | 156 | 85 | 2.1119 | 9.294 | 0.511 |
| SiON | 196 | 30 | 1.6169 | -62.118 | -4.295 |
| SiON | 156 | 85 | 2.1119 | 9.294 | 0.511 |
| SiON | 196 | 30 | 1.6169 | -62.118 | -4.295 |
| SiON | 156 | 85 | 2.1119 | 9.294 | 0.511 |
| Average Stress on InP | | | | | -33.474 |

Figure 18C:
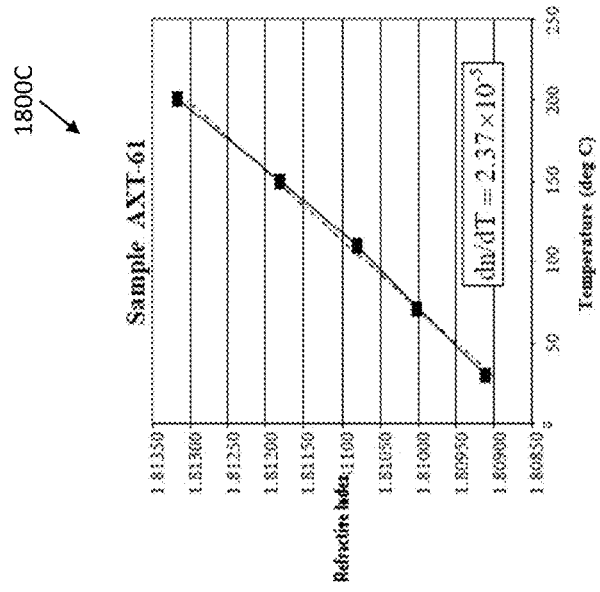
FIGS. 18B and 18C are graphs showing experimentally measured refractive index variations of first and second silicon oxynitride waveguide structures according to another embodiment of the present invention.
Figure 18B:
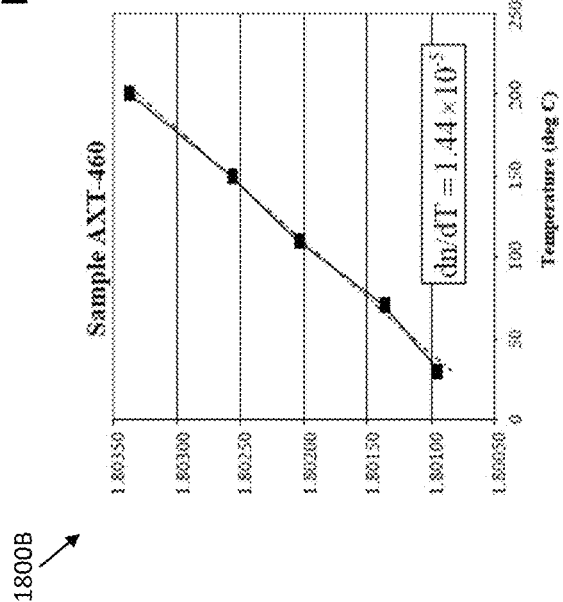

Referring now to FIGS. 18B and 18C, graphs 1800B and 1800C depicting refractive index temperature dependence measurements for two different silicon oxynitride waveguide structures in accordance with an embodiment of the present invention are shown. The FIGS. 18B and 18C depict refractive index temperature dependence measurements for first and second silicon oxynitride samples, AXT-460 and AXT-61, which exhibit refractive index variations of dn/dT=1.44×10-5 and dn/dT=2.37×10-5, respectively, confirming the reduced temperature dependence of the refractive index.

Figure 19:
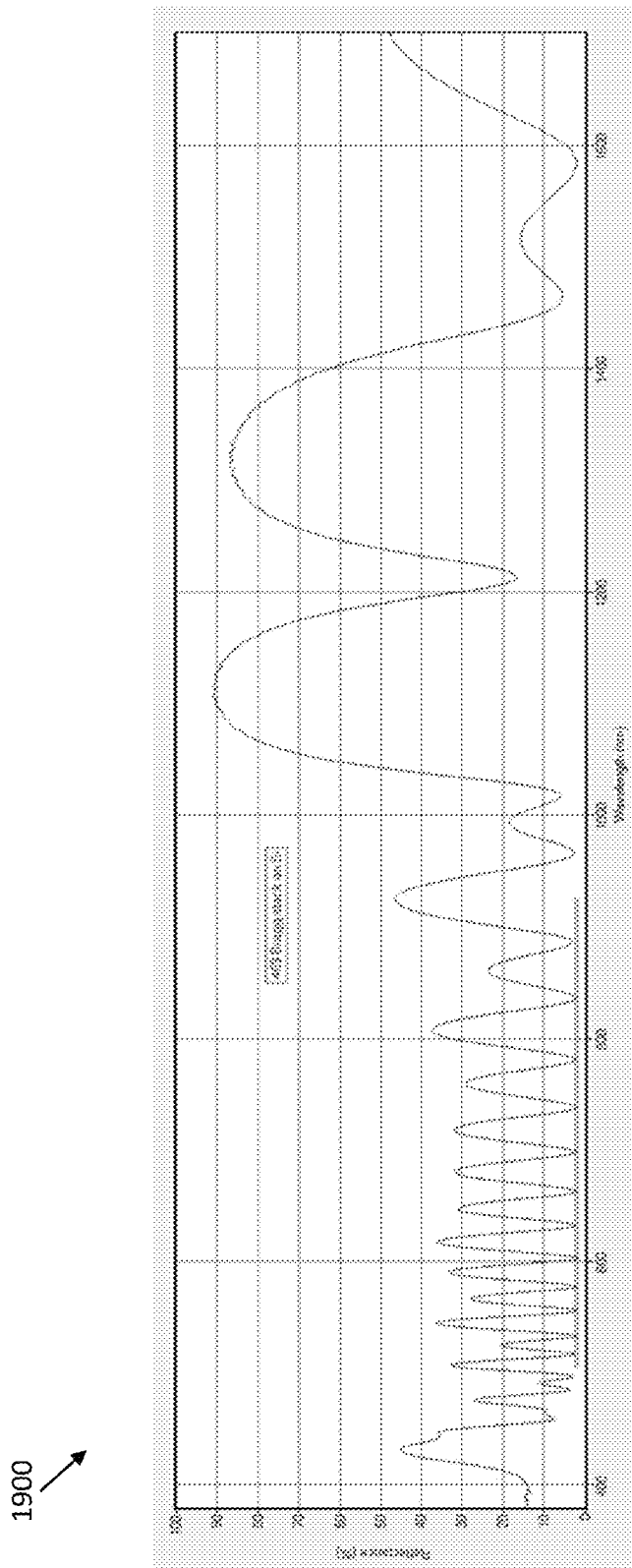
FIG. 19 is a graph showing performance of a low finesse dielectric Bragg stack formed on silicon according to another embodiment of the present invention.

Referring now to FIG. 19, a reflectance spectrum 1900 depicting performance of a low finesse (λ/4) dielectric Bragg stack 1002 formed on silicon in accordance with an embodiment of the present invention is shown. The SOE 1000 provides spontaneous emission when the wavelength of the optical signal is less than 1000 nm. At a wavelength range between 1000 nm and 1400 nm, the dielectric Bragg stack 1002 provides a low reflectance and the SOE 1000 outputs the optical signal by way of the dielectric Bragg stack 1002.

Figure 20:
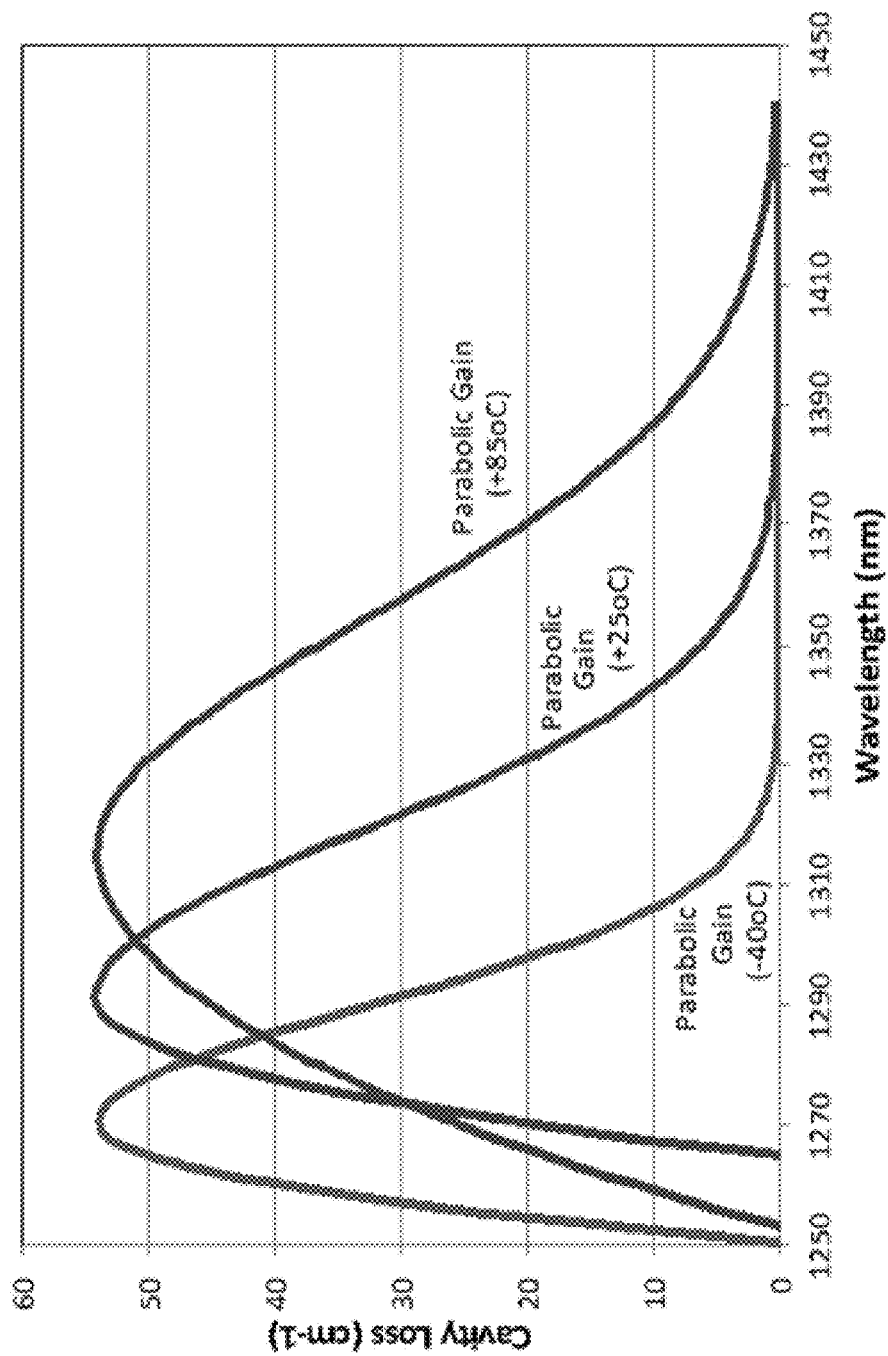
FIG. 20 is a graph showing functional representation of a gain of the SOE of the FIG. 10A based upon a parabolic-Gaussian model according to another embodiment of the present invention.

Referring now to FIG. 20, a functional representation of a gain of the SOE 1000 based upon a parabolic-Gaussian model for three different temperatures, T=−40° C.; +25° C.; +85° C. in accordance with an embodiment of the present invention is shown. The gain functions derived from fitting to actual SOE devices in respect of predicting threshold, wavelength, and efficiency are given by Equations (2) to (5) respectively as a function of threshold current density I. The gain spectra and Bragg wavelength position can both be established to support uncooled operation 0° C.≤T≤70° C.

$$G(\lambda, I) = G_O \ln\left(\frac{I}{I_O}\right) + b\left(\frac{(\lambda - \lambda_P)}{\Delta\lambda}\right)^2 \text{ for } \lambda \leq \lambda_P \quad (2)$$

$$G(\lambda, I) = G_O \ln\left(\frac{I}{I_O}\right) * \exp\left(\frac{(\lambda - \lambda_P)^2}{\sigma^2}\right) \text{ for } \lambda > \lambda_P \quad (3)$$

$$\lambda_P = \lambda_P(I = 0) - \frac{d\lambda}{dI} I \quad (4)$$

$$\sigma^2 = \sigma(I = 0) - \frac{d\sigma}{dI} I \quad (5)$$

Figure 21:
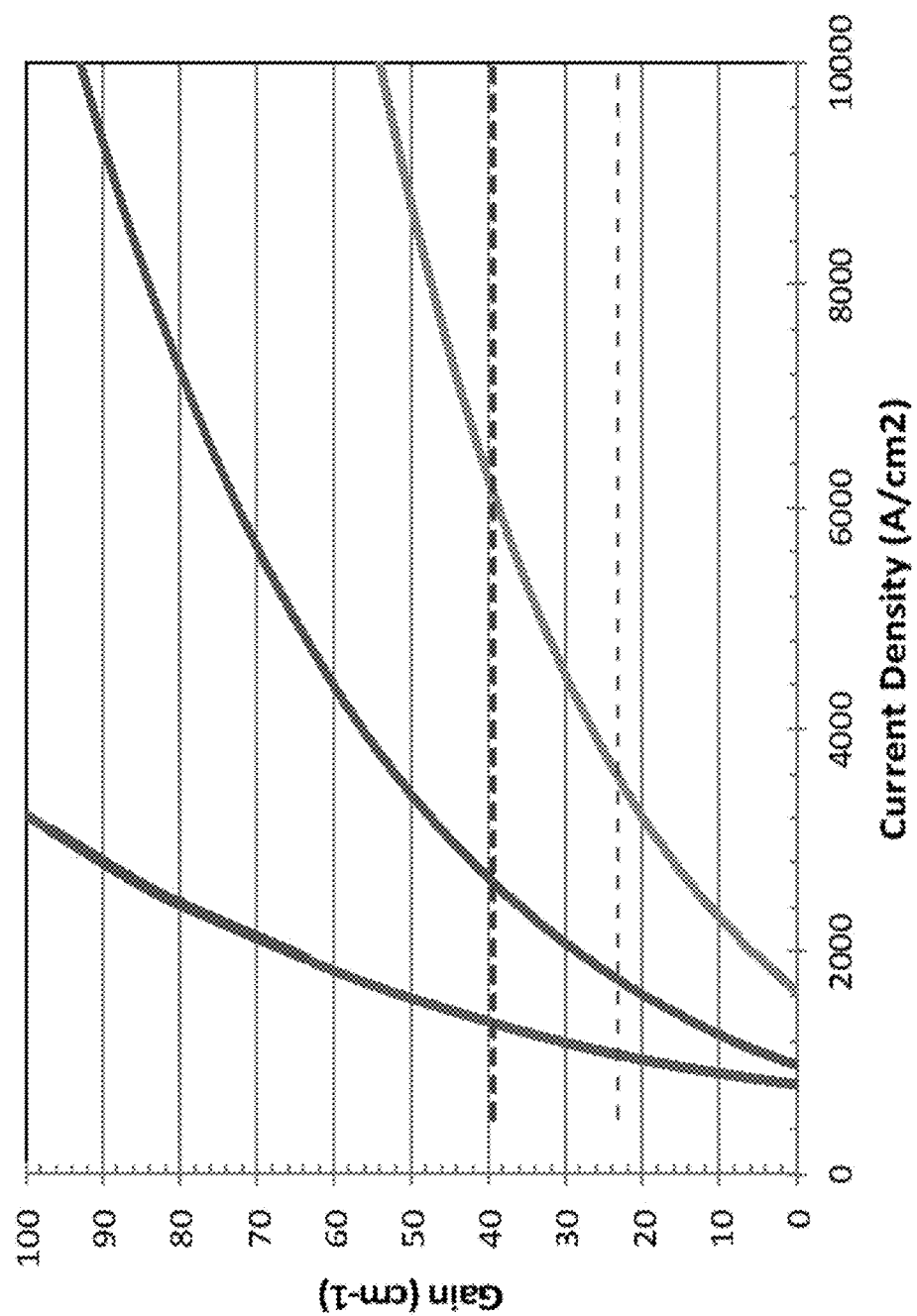
FIG. 21 is a graph showing gain-current curves for the SOE of the FIG. 10A based on simulated results according to another embodiment of the present invention.

Referring now to FIG. 21, gain-current curves for the SOE 1000 based on simulated results in accordance with an embodiment of the present invention is shown. Logarithmic gain can be employed to establish a threshold current. The results depicted in FIG. 21 are comparable to prior art InGaAlAs ridge lasers which exhibit $G_0=70$ cm$^{-1}$; 40 cm$^{-1}$; 30 cm$^{-1}$ at T=−40° C.; +25° C.; +85° C. compared to the simulated values of $G_0=72$ cm$^{-1}$; 40 cm$^{-1}$; 30 cm$^{-1}$ for the SOE 1000. Assuming a negative detuning at 25° C. and a 2% reflectivity (mirror loss of cavity) for the SOE 1000, the loss of the FP laser cavity 1012 is depicted for a 500 μm cavity showing that lasing at +85° C. can be achieved for current densities exceeding approximately 6200 Acm$^{-2}$.

Figure 22:
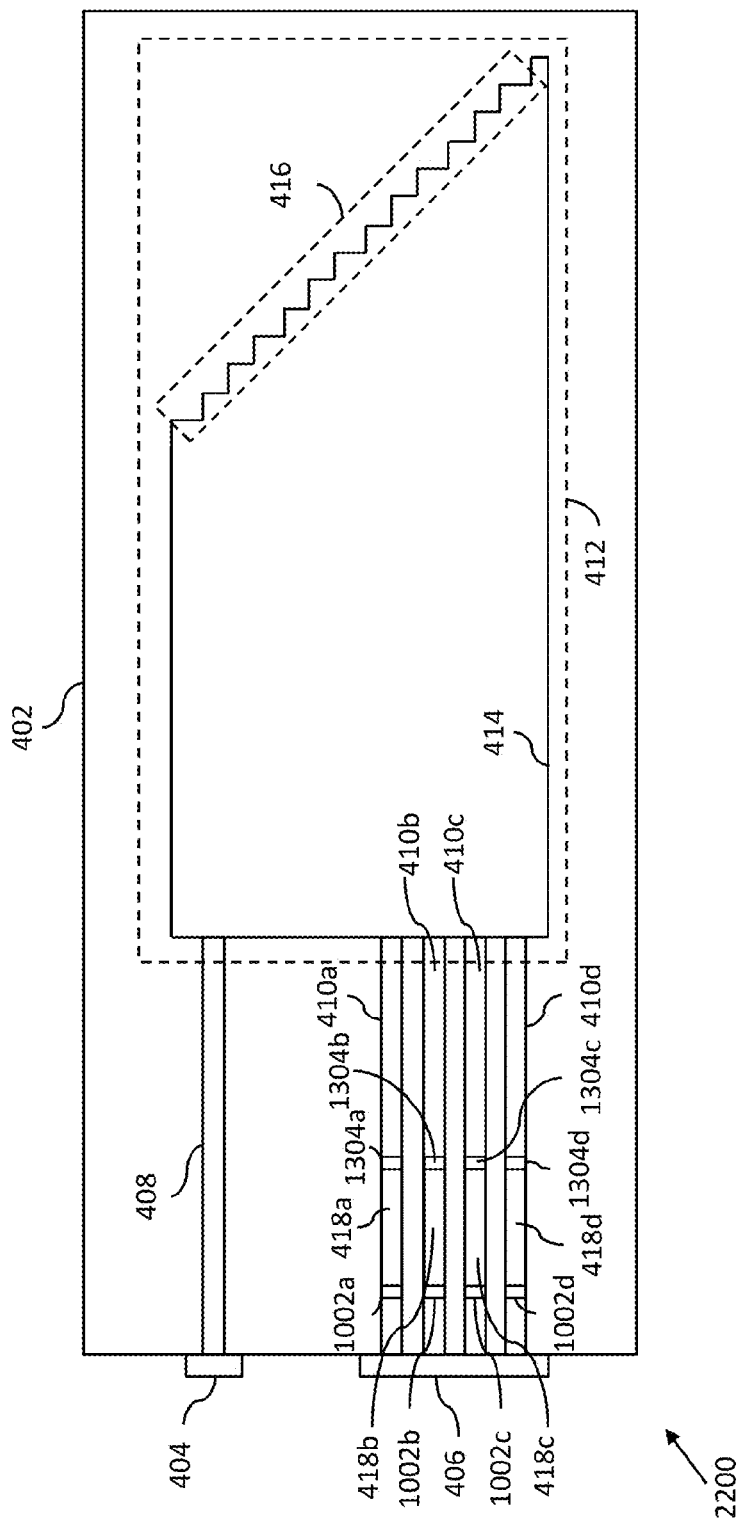
FIG. 22 is a photonic integrated device (PID) according to yet another embodiment of the present invention.

Referring now to FIG. 22, a PID 2200 according to another embodiment of the present invention is shown. The PID 2200 is grown by epitaxy on the substrate 402. The PID 2200 includes the first and second reflective structures 404 and 406, the common waveguide 408, the semiconductor waveguides 410, and the dielectric waveguide based wavelength dependent element 412 of the PID 400A of FIG. 4. The dielectric waveguide based wavelength dependent element 412 is formed in an optical cavity of the PID 2200. The common waveguide 408 and the semiconductor waveguides 410 are grown using the epitaxial layer structure. The dielectric waveguide based wavelength dependent element 412 includes the dielectric waveguide 414 and the grating element 416. The dielectric waveguide based wavelength dependent element 412 is formed on first regions of the substrate 402, the common waveguide 408, and the first through fourth semiconductor waveguides 410a-410d. The PID 2200 further includes the first through fourth active gain regions that includes the first through fourth active structures 418a-418d. The first through fourth active structures 418a-418d are disposed on the first through fourth semiconductor waveguides 410a-410d, respectively and are optically coupled to the dielectric waveguide based wavelength dependent element 412. The active structures 418 further includes first through fourth dielectric Bragg stacks 1002a-1002d deposited on corresponding first facets of the first through fourth active structures 418a-418d, respectively. The active structures 418 further include first through fourth reflectors 1304a-1304d formed on corresponding second facets of the PID 2200 using a metallic based mirror. The first through fourth active structures 418a-418d are structurally similar to the active structure of FIG. 17. Thus, in this configuration the PID 2200 functions as a multiplexer. It will be understood by those of skill in the art that the PID 2200 can be configured to function as demultiplexer.

The epitaxial structures of the common and semiconductor waveguides 408 and 410 address and resolve issues of gain saturation. The common waveguide 408 and the semiconductor waveguides 410 incorporate the passive waveguides, i.e., multiple alternating layers of the III-V compound semiconductor layer 602 and the etch stop layers 604 to enable a transparent and de-coupled gain medium for each active structure 418 within the PIDs 400A and 400B. Embodiments of the invention may exploit buried heterostructure (BH) or ridge laser gain sections to enable single wavelength selection. Further, implementing the dielectric waveguide 702 in PID 400A significantly reduces the wavelength dependent drift. Furthermore, the shift in temperature for each wavelength of the optical signal propagating through the dielectric waveguide 414 is equal.

The PID 1300 exploiting the dielectric Bragg stack 1002 and the reflector 1010 with the SOE 1000 using an etched facet design approach allows both monolithic integration and discrete die.

By exploiting SiO$_X$N$_Y$/SiO$_X$N$_Y$ low stress dielectric Bragg stacks 1002, a sufficiently high Δn enables single mode operation. Further, the low stress dielectric Bragg stack 1002 provides a replacement for complex, expensive re-grown DFB lasers with a single dielectric Bragg stack laser that supports uncooled operation over a wide temperature range. Furthermore, the low temperature dependent wavelength shift of the dielectric Bragg stack 1002 implies that the wavelength shifts 5 times lower, and potentially even lower, than conventional DFB lasers.

The dielectric Bragg stack 1002 with a silicon oxynitride (SiO$_X$N$_Y$) waveguide (i.e., the dielectric PID waveguide 1602) can be integrated as "zig-zag" filters for arrayed emitters, thereby producing the response of an on-chip thin film filter through monolithic integration. Since, filter response of the SOE 1000 depends on the dielectric refractive index change of the dielectric Bragg stack 1002, the FP laser cavity 1012 with small linewidth and low temperature dependence can be achieved.

The etched ridge waveguide device geometries with the etch stop layers 1204, 1212, and 1710 allows fabrication of a step within the device geometry allowing for deposition and etched facet designs. The etch stop layers 604, 1204, and 1710 provides a flat surface for deposition of the dielectric waveguide 702, the dielectric Bragg stack 1002, and the dielectric PID waveguide 1704, respectively. Further, the etch stop layers 604, 1204, and 1710 provides a reference point for calibrating the thickness of the dielectric Bragg stack 1002. In another embodiment, when the SOE 1000 is implemented as a buried heterostructure laser, the threshold current reduces due to the smaller size of the buried heterostructure laser.

The single layer dielectric 1022 allows enhanced output power whilst the short FP laser cavity 1012 supports high modulation rates in direct current modulation operation. Further, the design methodologies support direct integration of the SOE 1000 within PID 400 through low stress dielectrics. Embodiments of the invention may exploit at least one of InP PIDs, GaAs PIDs, and through wafer bonding to silicon substrates with the dielectric waveguide 702 on the substrate 402.

Within the preceding embodiments of the invention these have been described with respect to wavelength division multiplexers and primarily receiver side devices demultiplexing and coupling to photodetectors. However, it would be evident to a person skilled in the art that the methods and designs may be modified and adapted to provide a range of optical components and optical functions where the dielectric waveguide 702 reduces the wavelength sensitivity of the implemented optical component and optical function relative to the optical component that are implemented solely within a compound semiconductor structure.

The foregoing disclosure of the exemplary embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

The invention claimed is:

1. A photonic integrated device comprising:
   an epitaxial structure comprising a plurality of compound semiconductor layers;
   a dielectric waveguide based wavelength dependent element disposed within an optical cavity of the photonic integrated device; and
   a dielectric Bragg stack disposed at a predetermined region of an active structure, wherein the active structure is disposed on the epitaxial structure, and wherein the active structure is optically coupled to the dielectric waveguide based wavelength dependent element.

2. The photonic integrated device of claim 1, further comprising:
   first and second reflective structures having first and second predetermined reflectivities, respectively, wherein a common waveguide is optically coupled to the first reflective structure, and at least one semiconductor waveguide is optically coupled to the second reflective structure, and wherein the epitaxial structure forms the common waveguide and the at least one semiconductor waveguide; and
   at least one active gain region disposed between the first and second reflective structures, wherein the at least one active gain region includes the active structure.

3. The photonic integrated device of claim 2, wherein the dielectric waveguide based wavelength dependent element is formed on first regions of a substrate, the common waveguide, and the at least one semiconductor waveguide, wherein the dielectric waveguide based wavelength dependent element provides a wavelength dependent loss between the first and second reflective structures, and wherein the dielectric waveguide based wavelength dependent element comprises:
   a dielectric waveguide that is in optical contact with the common waveguide and the at least one semiconductor waveguide; and
   a grating element that is optically coupled to the dielectric waveguide, wherein the grating element is at least one of an echelle grating and an arrayed waveguide grating.

4. The photonic integrated device of claim 2, wherein the epitaxial structure comprises:
   a passive waveguide structure formed on a substrate, and that includes a plurality of alternating layers of a III-V compound semiconductor layer and an etch stop layer;
   a spacer layer formed on the passive waveguide structure; and
   a transition waveguide formed on the spacer layer, wherein the active structure is disposed on the transition waveguide, and wherein the transition waveguide is evanescently coupled to the active structure.

5. The photonic integrated device of claim 4, wherein the dielectric waveguide based wavelength dependent element includes a dielectric waveguide, and wherein the dielectric waveguide is butt-coupled to the transition waveguide, and wherein the transition waveguide optically couples an optical signal to the dielectric waveguide.

6. The photonic integrated device of claim 1, wherein the active structure comprises:
   a first semiconductor layer;
   a first etch stop layer formed on the first semiconductor layer;
   a second semiconductor layer formed on the first etch stop layer, wherein the first and second semiconductor layers are formed using a III-V compound semiconductor material;
   a plurality of quantum well layers formed on the second semiconductor layer;
   a spacer layer formed on the plurality of quantum well layers;
   a second etch stop layer formed on the spacer layer, wherein the first and second semiconductor layers, the first and second etch stop layers, and the plurality of quantum well layers form an active semiconductor waveguide; and
   a ridge structure formed on the second etch stop layer, wherein the ridge structure includes:
      a ridge layer formed on the second etch stop layer;
      a contact layer formed on the ridge layer, wherein the ridge and contact layers are formed using a III-V compound semiconductor material; and
      a metal contact formed on the contact layer.

7. The photonic integrated device of claim 1, wherein the dielectric Bragg stack is formed upon a first facet of the active structure, wherein the dielectric Bragg stack comprises:
   a plurality of alternating layers of first and second dielectric layers, wherein the first dielectric layer has a first refractive index and a first thickness, and wherein the second dielectric layer has a second refractive index and a second thickness; and
   a Bragg phase shift layer disposed at a predetermined region of the dielectric Bragg stack, wherein the Bragg phase shift layer has a third thickness and the second refractive index.

8. The photonic integrated device of claim 7, further comprising:
   a reflector formed upon a second facet of the active structure, wherein the reflector provides a peak reflectivity, and wherein the reflector comprises:
      a third dielectric layer formed upon the second facet, wherein the third dielectric layer has the second refractive index and the second thickness; and
      a metal layer formed upon the third dielectric layer.

9. The photonic integrated device of claim 8, further comprising:
   the active structure, the dielectric Bragg stack, and the reflector forming a first optical element of a plurality of optical elements;
   the plurality of optical elements also including second through fourth optical elements;
   the first through fourth optical elements being disposed on a substrate in a zig-zag configuration, spaced apart from each other; and
   a reflective structure disposed in front of first facets of the first through fourth optical elements, and spaced apart from the first through fourth optical elements.

10. The photonic integrated device of claim 1, wherein:
   the dielectric waveguide based wavelength dependent element includes a dielectric waveguide,
   the dielectric waveguide is formed adjacent to the dielectric Bragg stack, the dielectric waveguide comprises:
      a core layer deposited on the dielectric Bragg stack; and
      a cladding layer deposited on the core layer,
   the core and cladding layers are formed using a dielectric material, and an optical signal is coupled from the active structure to the core layer.

11. A photonic integrated device, comprising:
first and second reflective structures having first and second predetermined reflectivities, respectively, wherein a common waveguide is optically coupled to the first reflective structure, and at least one semiconductor waveguide is optically coupled to the second reflective structure;
a dielectric waveguide based wavelength dependent element formed on first regions of a substrate, the common waveguide and the at least one semiconductor waveguide, wherein the dielectric waveguide based wavelength dependent element provides a wavelength dependent loss between the first and second reflective structures; and
at least one active gain region disposed between the first and second reflective structures.

12. The photonic integrated device of claim 11, wherein the dielectric waveguide based wavelength dependent element comprises:
a dielectric waveguide that is in optical contact with the common waveguide and the at least one semiconductor waveguide; and
a grating element that is optically coupled to the dielectric waveguide, wherein the grating element is at least one of an echelle grating and an arrayed waveguide grating.

13. The photonic integrated device of claim 12, wherein the dielectric waveguide comprises:
a first dielectric layer deposited on an etched portion of the common waveguide and at least one the semiconductor waveguide; and
a second dielectric layer deposited on the first dielectric layer, wherein the first and second dielectric layers are adjacent to the grating element.

14. The photonic integrated device of claim 13, wherein a metal reflector is deposited on at least one of first and second sides of the echelle grating.

15. The photonic integrated device of claim 11, further comprising:
a passive waveguide structure formed on a second region of the substrate, and that includes a plurality of alternating layers of a III-V compound semiconductor layer and an etch stop layer;
a spacer layer formed on the passive waveguide structure;
a transition waveguide formed on the spacer layer;
an n-type contact layer formed on the transition waveguide;
an n-type ridge layer formed on the n-type contact layer;
a plurality of quantum well layers formed on the n-type ridge layer;
a p-type ridge layer formed on the plurality of quantum well layers; and
a p-type contact layer formed on the p-type ridge layer, wherein the plurality of quantum well layers generate an optical signal based on an electrical signal supplied to the p-type contact layer, wherein the spacer layer, the transition waveguide, the n-type ridge layer, and the p-type ridge layer are formed using a III-V compound semiconductor material, wherein the n-type and p-type contact layers, the n-type and p-type ridge layers, and the plurality of quantum well layers form the at least one active gain region, wherein the passive waveguide structure and the spacer layer form the common waveguide and the at least one semiconductor waveguide, and wherein the transition waveguide is formed above the passive waveguide structure.

16. The photonic integrated device of claim 11, wherein the second predetermined reflectivity is greater than the first predetermined reflectivity, and wherein the at least one active gain region is deposited on the at least one semiconductor waveguide, and wherein the at least one active gain region is coupled to the at least one semiconductor waveguide via evanescent coupling.

17. The photonic integrated device of claim 11, wherein the first predetermined reflectivity is greater than the second predetermined reflectivity, wherein the at least one active gain region is deposited on the common waveguide, and wherein the at least one active gain region is coupled to the common waveguide via evanescent coupling.

18. The photonic integrated device of claim 11, wherein the photonic integrated device is one of a buried heterostructure and a ridge waveguide.

19. A photonic integrated device, comprising:
a first substrate;
a semiconductor structure comprising a plurality of layers, that is formed above the first substrate, wherein the semiconductor structure defines an active semiconductor waveguide that extends between first and second facets of the semiconductor structure, and wherein the active semiconductor waveguide provides an optical gain to an optical signal propagating within the active semiconductor waveguide;
a dielectric Bragg stack formed upon the first facet, wherein the dielectric Bragg stack comprises a plurality of dielectric layers, and wherein the dielectric Bragg stack has a peak transmittance at a predetermined wavelength of the optical signal; and
a reflector formed upon the second facet, wherein the reflector provides a peak reflectivity at a plurality of wavelengths of the optical signal.

20. The photonic integrated device of claim 19, wherein the dielectric Bragg stack comprises:
a plurality of alternating layers of first and second dielectric layers, wherein the first dielectric layer has a first refractive index and a first thickness, and wherein the second dielectric layer has a second refractive index and a second thickness; and
a Bragg phase shift layer disposed at a predetermined region of the dielectric Bragg stack, wherein the Bragg phase shift layer has a third thickness and the second refractive index.

21. The photonic integrated device of claim 20, wherein the reflector comprises:
a third dielectric layer formed upon the second facet, wherein the third dielectric layer has the second refractive index and the second thickness; and
a metal layer formed upon the third dielectric layer.

22. The photonic integrated device of claim 20, wherein when a difference between the first and second refractive indices exceeds a predetermined value, the optical signal is single mode over a predetermined ambient temperature range.

23. The photonic integrated device of claim 19, wherein the semiconductor structure comprises:
a first semiconductor layer;
a first etch stop layer formed on the first semiconductor layer;
a second semiconductor layer formed on the first etch stop layer, wherein the first and second semiconductor layers are formed using a III-V compound semiconductor material;
a plurality of quantum well layers formed on the second semiconductor layer;
a spacer layer formed on the plurality of quantum well layers;

a second etch stop layer formed on the spacer layer, wherein the first and second semiconductor layers, the first and second etch stop layers, and the plurality of quantum well layers form the active semiconductor waveguide; and a ridge structure formed on the second etch stop layer, wherein the ridge structure includes:
  a ridge layer formed on the second etch stop layer;
  a contact layer formed on the ridge layer, wherein the ridge and contact layers are formed using a III-V compound semiconductor material; and
  a metal contact formed on the contact layer.

24. The photonic integrated device of claim 23, further comprising:
  a passive waveguide structure formed on the first substrate, and that comprises a plurality of alternating layers of a III-V compound semiconductor layer and an intermediate etch stop layer;
  a spacer layer formed on the passive waveguide structure; and
  a transition waveguide formed on the spacer layer, wherein the spacer layer and the transition waveguide are formed using a III-V compound semiconductor material, wherein the semiconductor structure is formed on the transition waveguide, and wherein the semiconductor structure evanescently couples the optical signal to the transition waveguide.

25. The photonic integrated device of claim 24, further comprising a dielectric waveguide butt-coupled to the transition waveguide, wherein the transition waveguide optically couples the optical signal to the dielectric waveguide.

26. The photonic integrated device of claim 23, further comprising a dielectric waveguide formed adjacent to the dielectric Bragg stack, wherein the dielectric waveguide comprises:
  a core layer deposited on the dielectric Bragg stack; and
  a cladding layer deposited on the core layer, wherein the core and cladding layers are formed using a dielectric material, and wherein the optical signal is coupled from the semiconductor structure to the core layer.

27. The photonic integrated device of claim 23, further comprising an anti-reflection coating layer deposited between at least one of the dielectric Bragg stack and the first facet, and the reflector and the second facet.

28. The photonic integrated device of claim 19, wherein the first substrate is wafer bonded to a second substrate, and wherein the second substrate is a silicon substrate.

29. The photonic integrated device of claim 19, further comprising:
  a plurality of optical elements including first through fourth optical elements, wherein each optical element of the plurality of optical elements includes the semiconductor structure, the dielectric Bragg stack, and the reflector, wherein the first through fourth optical elements are disposed on the first substrate in a zig-zag configuration, and are spaced apart from each other;
  a reflective structure disposed in front of first facets of the first through fourth optical elements, and spaced apart from the first through fourth optical elements; and
  a dielectric waveguide deposited between the plurality of optical elements and the reflective structure.

* * * * *